US012028824B2

United States Patent
Chowdhury et al.

(10) Patent No.: US 12,028,824 B2
(45) Date of Patent: Jul. 2, 2024

(54) METHOD AND APPARATUS FOR SOFTWARE DEFINED RADIO WITH TIMING, PHASE, AND FREQUENCY SYNCHRONIZATION

(71) Applicant: Northeastern University, Boston, MA (US)

(72) Inventors: Kaushik Chowdhury, Needham, MA (US); Ufuk Muncuk, Waltham, MA (US); Yousof Naderi, Brookline, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 17/700,331

(22) Filed: Mar. 21, 2022

(65) Prior Publication Data

US 2022/0303929 A1 Sep. 22, 2022

Related U.S. Application Data

(60) Provisional application No. 63/163,127, filed on Mar. 19, 2021.

(51) Int. Cl.
*H04W 56/00* (2009.01)
*H04L 7/00* (2006.01)

(52) U.S. Cl.
CPC ......... *H04W 56/005* (2013.01); *H04L 7/0033* (2013.01)

(58) Field of Classification Search
CPC ....... H04W 56/005; H04L 7/0033; H03L 7/18
See application file for complete search history.

(56) References Cited

U.S. PATENT DOCUMENTS 10,517,054 B2 * 12/2019 McConnell .......... H04B 7/0848

OTHER PUBLICATIONS

Abari et al., "Poster: clock synchronization for distributed wireless protocols at the physical layer", MobiCom '14: Proceedings of the 20th annual international conference on Mobile computing and networking, Sep. 2014, 3 Pages.
Alemdar et al., "RFClock: timing, phase and frequency synchronization for distributed wireless networks", ACM MobiCom '21, Oct. 2021, 13 Pages.
Abari et al., "AirShare: Distributed coherent transmission made seamless", InfoCom15, 2015, 9 Pages.

(Continued)

*Primary Examiner* — Jamal Javaid
(74) *Attorney, Agent, or Firm* — Verrill Dana, LLP

(57) ABSTRACT

Provided herein are methods and apparatus for a self-synchronizing software defined radio apparatus wherein the method includes instructing, by a leader module of an RF clock module of the software defined radio apparatus and via a controller module comprising a central coordinator operative to provide a data bridge, a radio frequency (RF) transceiver to transmit a two-tone frequency signal at $f_1$ and $f_2$ over air, separated by a desired input clock frequency, the RF transceiver operative to receive and transmit RF signals, receiving, at a follower module, a transmitted signal, extracting, by the follower module, an envelope of the received signal, and passing the received signal through a filter to obtain a reference clock without modifying existing physical/link layer protocols.

19 Claims, 25 Drawing Sheets

(56) References Cited

OTHER PUBLICATIONS

Bidigare et al., "Implementation and Demonstration of Receiver Coordinated Distributed Transmit Beamforming across an Ad-hoc Radio Network", Proc. of Asilomar Conference on Signals, Systems and Computers (ASILOMAR). Pacific Grove, CA, 2012, 5 Pages.

Cho et al., "Synchronization for OFDM", MIMO-OFDM Wireless Communications with MATLAB, Chapter 5. Wiley Publishing, 2010, 35 Pages.

Decaware, DW1000 User Manual, Downloaded on Jan. 18, 2024 fromqorvo.com/products/d/da007967, Decawave Ltd. 2017, pp. 1-249.

Analog Devices, ADF4001 Clock Generator; Downloaded on Jan. 18, 2024 from analog.com/en/ products/adf4001.html/ ; 2013, 17 Pages.

Elson et al., "Fine-Grained Network Time Synchronization using Reference Broadcasts", ACM SIGOPS Operating Systems Review 36, SI (2002), 15 Pages.

Ettus GPSDO, Downloaded on Jan. 18, 2024 from kb.ettus.com/GPSDO/ ; 8 Pages.

Ettus Octoclock, Downloaded on Jan. 18, 2024 from ettus.com/all-products/octoclock/ ; 4 Pages.

FCC Part 15 of the FCC rules, Downloaded on Jan. 18, 2024 from ecfr.gov/cgi-bin/text-idx?SID=eed706a2c49fd9271106c3228b0615f3&mc=true&node=pt47.1.15&rgn= div5#se47.1.15_124/ ; 176 Pages.

Friss, H. T., "A Note on a Simple Transmission Formula", Proceedings of the IRE, vol. 34, No. 5, pp. 254-256, May 1946.

Ganeriwal et al., "Timing-sync protocol for sensor networks", Proceedings of the 1st international conference on Embedded networked sensor systems, (2003). 12 Pages.

Li et al., "Towards Programming the Radio Environment with Large Arrays of Inexpensive Antennas", Proceedings of the 16th USENIX Conference on Networked Systems Design and Implementation (Boston, MA, USA) 2019 (NSDI'19). USENIX Association, USA, pp. 285-299.

MATLAB WLAN Toolbox, 802.11a, Procedure Protocol Data Unit, Downloaded on Jan. 18, 2024 from mathworks.com/help/wlan/ug/wlan-ppdu-structure.html/ ; 20 Pages.

Nguyen et al., "Sub-Microsecond Network Synchronization for Distributed Wireless PHY Protocols", Proceedings of the 9th ACM Workshop on Wireless of the Students, by the Students, and for the Students; 2017, pp. 3-5.

Rahul et al., "SourceSync: A Distributed Wireless Architecture for Exploiting Sender Diversity", ACM SIGCOMM Computer Communication Review 40, 4 (2010), 171-182.

Rahul et al., "MegaMIMO: Scaling Wireless Capacity with User Demands", ACM SIGCOMM 2012. Helsinki, Finland, 12 Pages.

Razavizadeh et al., "3D Beamforming in Reconfigurable Intelligent Surfaces-assisted Wireless Communication Networks", (2020), Downloaded on Jan. 19, 2024 from arxiv.org/pdf/2001.06653.pdf , 5 Pages.

Singh et al., "Millimeter-Wave Full Duplex Radios", Proceedings of the 26th Annual International Conference on Mobile Computing and Networking (London, United Kingdom) (MobiCom '20). Association for Computing Machinery, New York, NY, USA, Article 2, 14 pages, Downloaded on Jan. 19, 2024 from swarunkumar.com/papers/mmfd-mobicom2020.pdf.

Sourour et al., "Frequency off-set estimation and correction in the IEEE 802.11 a wlan", Vehicular Technology Conference 7, SI (2004), 4923-4927.

Yenamandra et al., "Vidyut: Exploiting Power Line Infrastructure For Enterprise Wireless Networks", ACM SIGCOMM Computer Communication Review 44, 4 (2014), 12 Pages.

\* cited by examiner

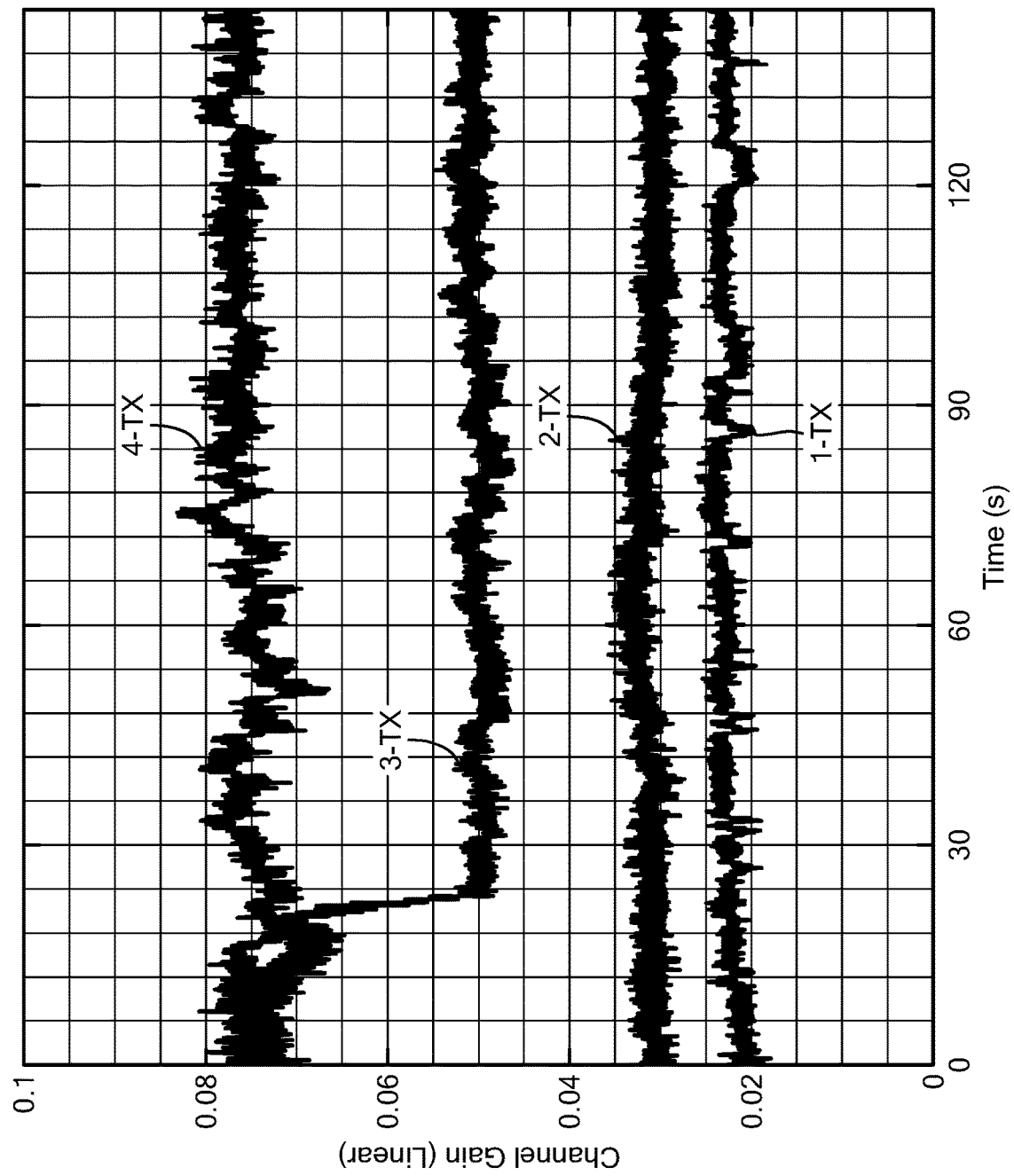

METHOD AND APPARATUS FOR SOFTWARE DEFINED RADIO WITH TIMING, PHASE, AND FREQUENCY SYNCHRONIZATION

CROSS REFERENCE TO RELATED APPLICATIONS

This application claims benefit under 35 U.S.C. § 119(e) of U.S. Provisional Application No. 63/163,127, filed on 19 Mar. 2021, entitled "Method and Apparatus for Software Defined Radio with Timing, Phase, and Frequency Synchronization," the disclosure of which is incorporated by reference herein.

STATEMENT REGARDING FEDERALLY SPONSORED RESEARCH OR DEVELOPMENT

This invention was made with government support under Grant Number CNS1452628 awarded by NSF National Science Foundation and N66001-17-1-4042 awarded by DARPA Defense Advanced Research Projects Agency. The government has certain rights in the invention.

BACKGROUND

Wireless network architectures are undergoing a radical transformation, moving away from centralized control towards a distributed paradigm where devices make local decisions towards a shared, global objective. For example, network densification in 5G involves thousands of small cell base stations operating in proximity for an anticipated 1000× improvement in throughput, intelligent reflector arrays have large numbers of low-cost antennas to create smart surfaces and distributed coordinated beamforming (DCB) enables a number of radios to synchronize phase offsets and start times with sufficient accuracy and precision to permit beamforming towards a target receiver. However, from a system viewpoint, the performance and capability of such distributed devices for many of these applications has yet to realize its full potential. In particular, these limitations arise because even distributed devices exercising local decisions in furtherance of a shared objective remain shackled to a centralized clock. These limitations remain because, to date, no open source, physical layer solution has been found that can provide both the stable 20 MHz reference necessary for phase locking the constituent devices and the one (1) pulse per second (PPS) signal required for correcting oscillator drift as needed during software defined radio (SDR)-based experimentation through the wireless medium. That is, no solution exists that achieves both frequency and time reference without modifying existing physical/link layer protocols.

SUMMARY

A low-cost, power-efficient, and small form factor software defined radio (SDR) hardware architecture ("self-synchronizing SDR") is provided herein. The self-synchronizing SDR generally includes a customized software defined radio (SDR) hardware platform ("SDR hardware"), a timing, phase, and frequency synchronization platform ("RF clock") utilizing a leader-follower architecture, and an AI and controller platform.

In one aspect a method for self-synchronizing a software defined radio apparatus is provided. The method includes instructing, by a leader module of an RF clock module of the software defined radio apparatus and via a controller module comprising a central coordinator operative to provide a data bridge, a radio frequency (RF) transceiver to transmit a two-tone frequency signal at $f_1$ and $f_2$ over air, separated by a desired input clock frequency, the RF transceiver operative to receive and transmit RF signals. The method also includes receiving, at a follower module, a transmitted signal. The method also includes extracting, by the follower module, an envelope of the received signal. The method also includes passing the received signal through a filter to obtain a reference clock without modifying existing physical/link layer protocols.

In some embodiments, the method also includes amplifying, via a RF power amplifier, the two-tone frequency signal prior to transmission of the two-tone signal by the transceiver. In some embodiments, the step of extracting further comprises passing the received signal through a 4-stage rectifier. In some embodiments, the method also includes generating the two-tone signal by a RF frequency synthesizer locked to a reference signal of a reference oscillator of the software defined radio apparatus. In some embodiments, the method also includes combining the generated two-tone signal via an RF power-combiner. In some embodiments, the received signal is received by the RF transceiver. In some embodiments, the received signal is received by a second RF transceiver. In some embodiments, the method also includes correcting the reference signal of the reference oscillator according to a pulse per second signal from a pulse per second generator of the software defined radio apparatus.

In another aspect, a software defined radio apparatus is provided. The software defined radio apparatus includes a radio frequency (RF) transceiver operative to receive and transmit RF signals. The software defined radio apparatus also includes a controller module comprising a central coordinator operative to provide a data bridge. The software defined radio apparatus also includes an RF clock module. The RF clock module includes a leader module operative to instruct the RF transceiver, via the controller module, to transmit a two-tone frequency signal at $f_1$ and $f_2$ over air, separated by the desired input clock frequency. The RF clock module also includes a follower module operative to extract an envelope of a signal received by the transceiver and pass the signal through a filter to obtain a reference clock without modifying existing physical/link layer protocols.

In some embodiments, the leader module further comprises a reference oscillator for generating a reference signal. In some embodiments, the leader module further comprises a RF frequency synthesizer locked to the reference signal of the reference oscillator for generating the two-tone signal. In some embodiments, the leader module further comprises a RF power-combiner configured for combining the generated two-tone signal. In some embodiments, the leader module further comprises a RF power amplifier configured for amplifying the combined two-tone signal.

In some embodiments, the software defined radio apparatus also includes a pulse per second generator configured to produce a pulse per second signal. In some embodiments, the controller module is configured to correct the reference signal of the reference oscillator consistent with the pulse per second signal of the pulse per second generator. In some embodiments, the follower module further comprises a 4-stage rectifier configured to extract the envelope of the received signal. In some embodiments, filter is a band pass filter. In some embodiments, the filter is an adjustable impedance matching filter. In some embodiments, the software defined radio apparatus also includes a second RF transceiver configured to receive the received signal.

Additional features and aspects of the technology include the following:

1. A method for self-synchronizing a software defined radio apparatus, comprising:
   instructing, by a leader module of an RF clock module of the software defined radio apparatus and via a controller module comprising a central coordinator operative to provide a data bridge, a radio frequency (RF) transceiver to transmit a two-tone frequency signal at $f_1$ and $f_2$ over air, separated by a desired input clock frequency, the RF transceiver operative to receive and transmit RF signals;
   receiving, at a follower module, a transmitted signal;
   extracting, by the follower module, an envelope of the received signal; and
   passing the received signal through a filter to obtain a reference clock without modifying existing physical/link layer protocols.
2. The method of claim 1, further comprising amplifying, via a RF power amplifier, the two-tone frequency signal prior to transmission of the two-tone signal by the transceiver.
3. The method of claims 1-2, wherein the step of extracting further comprises passing the received signal through a 4-stage rectifier.
4. The method of claims 1-3, further comprising generating the two-tone signal by a RF frequency synthesizer locked to a reference signal of a reference oscillator of the software defined radio apparatus.
5. The method of claim 4, further comprising combining the generated two-tone signal via an RF power-combiner.
6. The method of claims 1-5, wherein the received signal is received by the RF transceiver.
7. The method of claims 1-6, wherein the received signal is received by a second RF transceiver.
8. The method of claim 4, further comprising correcting the reference signal of the reference oscillator according to a pulse per second signal from a pulse per second generator of the software defined radio apparatus.
9. A software defined radio apparatus, comprising:
   a radio frequency (RF) transceiver operative to receive and transmit RF signals;
   a controller module comprising a central coordinator operative to provide a data bridge; and
   an RF clock module comprising:
      a leader module operative to instruct the RF transceiver, via the controller module, to transmit a two-tone frequency signal at $f_1$ and $f_2$ over air, separated by the desired input clock frequency, and
      a follower module operative to extract an envelope of a signal received by the transceiver and pass the signal through a filter to obtain a reference clock without modifying existing physical/link layer protocols.
10. The software defined radio apparatus of claim 9, wherein the leader module further comprises a reference oscillator for generating a reference signal.
11. The software defined radio apparatus of claim 10, wherein the leader module further comprises a RF frequency synthesizer locked to the reference signal of the reference oscillator for generating the two-tone signal.
12. The software defined radio apparatus of claim 11, wherein the leader module further comprises a RF power-combiner configured for combining the generated two-tone signal.
13. The software defined radio apparatus of claim 12, wherein the leader module further comprises a RF power amplifier configured for amplifying the combined two-tone signal.
14. The software defined radio apparatus of claim 10, further comprising a pulse per second generator configured to produce a pulse per second signal.
15. The software defined radio apparatus of claim 14, wherein the controller module is configured to correct the reference signal of the reference oscillator consistent with the pulse per second signal of the pulse per second generator.
16. The software defined radio apparatus of claims 9-15, wherein the follower module further comprises a 4-stage rectifier configured to extract the envelope of the received signal.
17. The software defined radio apparatus of claim 9-16, wherein the filter is a band pass filter.
18. The software defined radio apparatus of claims 9-17, wherein the filter is an adjustable impedance matching filter.
19. The software defined radio apparatus of claims 9-18, further comprising a second RF transceiver configured to receive the received signal.

DESCRIPTION OF THE DRAWINGS

FIGS. 20A-B illustrate BER performance in different modulation schemes, with different synchronization methods, and channel gain with increasing number of transmitters.

DETAILED DESCRIPTION

Figure 1:
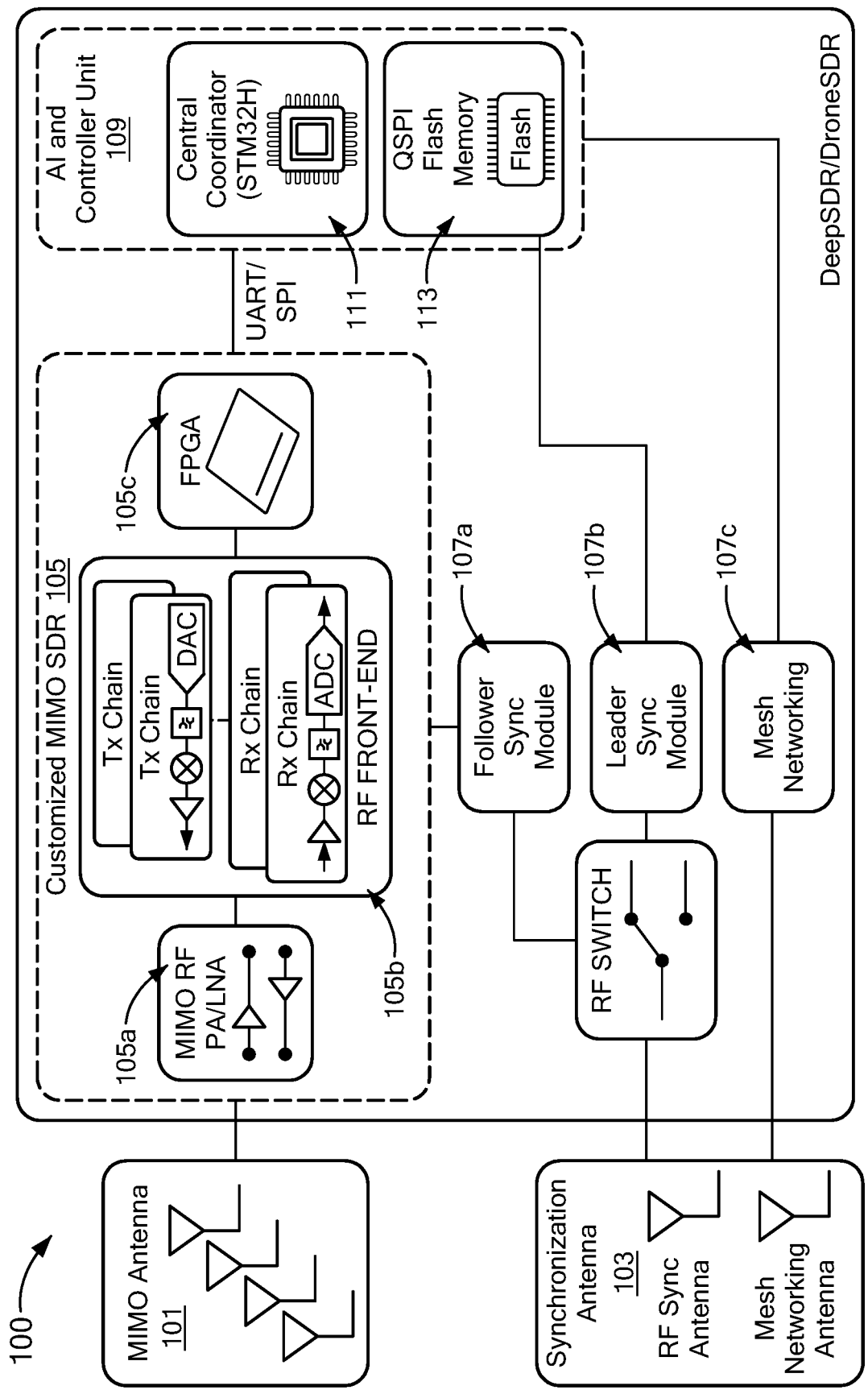
FIG. 1 is a diagram of overview of the self-synchronizing SDR system architecture and components.

Provided herein are self-synchronizing software defined radios (SDRs). The self-synchronizing SDRs generally include a customized SDR hardware platform ("SDR hardware"), a timing, phase, and frequency synchronization platform ("RF clock") having a leader-follower architecture, and an AI and controller platform.

Within the self-synchronizing SDR, the SDR hardware is used as an RF transceiver to perform full demodulation and modulation of the incident waveform at MIMO antennas to obtain a bit stream to/from AI and Controller module. The timing, phase and frequency RF clock generally includes a leader-follower architecture wherein a leader module transmits a two-tone frequency signal at $f_1$ and $f_2$ over the air, separated by the desired input clock frequency. A follower module extracts the envelope of the transmitted signal and passes it through a filtering process to obtain the reference clock without modifying existing physical/link layer protocols. In this manner, the RF clock system is designed, as a standalone unit, to generate a 10 MHz or 40 MHz/1PPS signal reference suitable for most commercial-off-the-shelf (COTS) SDRs today. This ability of the RF clock system to achieve both frequency and time reference without modifying existing physical/link layer protocols (e.g., generate both the 10 MHz reference and the 1PPS synchronization signal) permits the system to operate in generalized environments such that it does not require custom headers or messaging within the data-carrying protocol and is robust to interference through a frequency-agile operation. The AI and controller module includes a central coordinator which can perform as a data bridge between submodules and other units and coordinates all operations performed by submodules to provide a robust and reliable service.

Clock Error in Wireless Devices

Carrier Frequency Synchronization: Active wireless devices forming a link derive their carrier frequency from their own local oscillators (LO). Any drift in the LO results in a carrier frequency offset (CFO). The direct outcome of CFO is increased inter-symbol interference, or worse, the entire signal of interest can be filtered out by the front end as it does not fall in the desired frequency range.

Time Synchronization: In a distributed system, signal copies arrive at the receive antenna from different transmit antennas. These arriving signals need to be aligned on a per-symbol basis. This imposes strict timing constraints, with permissible deviations in the order of only few nanoseconds.

Carrier Phase Synchronization: Each emitted signal adds up constructively at the receiver. For optimal constructive effect, the received phases of the signals from individual transmitters must also be aligned at the receiver. Since transmitters are at different distances with respect to the receiver, this phase adjustment must be performed on a per-transmitter basis.

Practical clock oscillators exhibit deviations from their nominal frequency of operation due to imperfections in the manufacturing process, variations in supply voltage, and ambient temperature. Using variables $\phi$ and $f$ to denote phase and frequency, respectively, the relative frequency offset $\Delta f_{ij} = (f_i - f_j)$ is a simple function of oscillator frequency in the two radios i and j, with angular frequency $\omega_{ij} = 2\pi(f_i - f_j)$. The instantaneous phase relationship between clocks for these two different radios can now be expressed as:

$$\phi_j(t) = \Delta\theta_{ij} + \Delta\omega\omega_{ij}t + \phi_i(t) \qquad (1)$$

where $\Delta\theta_{ij}$ is the relative phase difference and $\Delta\omega_{ij}t$ is the phase rotation over time t. Thus, when $\Delta\theta_{ij}=0$ and $\Delta f_{ij}=0$, there is perfect synchronization in phase and frequency between clocks. Furthermore, let $\psi_i$ and $\psi_j$ represent the deviation from the nominal operating frequency $f_n$, with the relationship $f_i = f_n + \psi_i$ and $f_j = f_n + \psi_j$. Therefore, relative frequency offset becomes $\Delta f_{ij} = \psi_i - \psi_j$.

Figure 3:
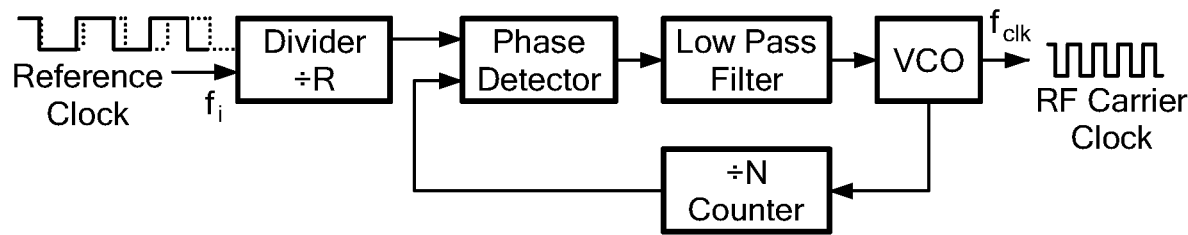
FIG. 3 illustrates the generation of RF carrier.

To derive a deeper insight on how clocks introduce errors during RF carrier generation by using equation (1), for transmitter i, let the carrier frequency $f_{clk}^i$ be obtained from the local oscillator, as shown in FIG. 3. Consider a PLL with frequency divider elements N and R, which influence the carrier frequency $f_{clk}^i = \kappa \cdot f_i$, where $\kappa = N/R$ scales the reference clock appropriately to generate the carrier. Components within the PLL architecture, such as phase detector, voltage-controlled oscillator (VCO), amplifier and power supply generate phase noise ($\psi_{PLL}$) that contribute noise sidebands in the power spectrum. Hence, for a given radio i, the carrier frequency becomes the summation $f_{clk}^i = \kappa \cdot f_i + \psi_{PLL}^i$. Therefore, a more accurate model of RF carrier clock is:

$$\phi_{clk}^j(t) = \Delta\theta_{clk}^{ij} + 2\pi\Delta\psi_{clk}^{ij} + \Delta\psi_{PLL}^{ij}(t) + \phi_{clk}^i(t) \qquad (2)$$

where the relative CFO is $\Delta\psi_{clk}^{ij} = \kappa \cdot (\psi_i - \psi_j)$ and phase noise is $\Delta\psi_{PLL}^{ij}(t) = \psi_{PLL}^i(t) - \psi_{PLL}^j(t)$, respectively. From Eq. 2, it can be seen that the oscillator phase noise is transferred to the RF carrier.

Wired Systems for Comparison

Figure 4:
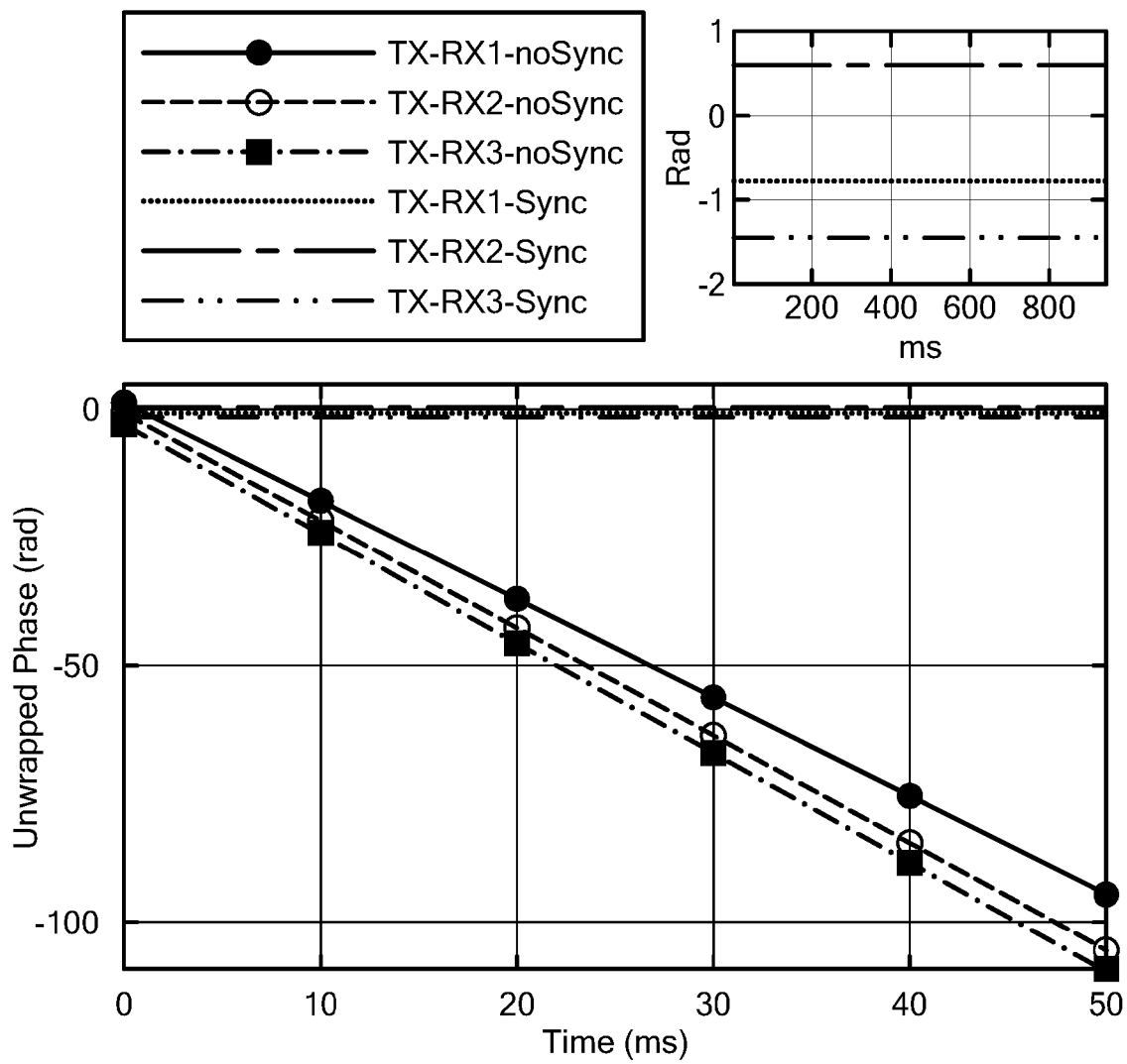
FIG. 4 illustrates instantaneous unwrapped phase of unmodulated signal received at different receiver SDRs.

To visualize the impact of the clock synchronization, a testbed of four Ettus B210 SDRs connected to a common host computer is deployed, three as receivers and one as transmitter. The transmitter sends an unmodulated signal over the air, which is received by the three receiver SDRs. It is aimed to validate the clock model described in Eq. 2 by analyzing the instantaneous unwrapped phase of received signals at different receivers. An Ettus Octoclock is used as the external reference clock (10 MHz) for all the radios as the clock drift between different radio oscillators can be observed. It can be seen from FIG. 4 that $\Delta\psi_{clk}^{ij}=0$. This is because the received signals exhibit a constant phase when connected to a common external clock. The relative CFO ($\Delta\psi_{clk}^{ij}$) for each transmitter-receiver pair can be found from the slope of the signals. The calculated CFOs, $\Delta\psi_{clk}^{ij}$, for each receiver with respect to the common transmitter is 136.9 Hz, 170.3 Hz and 207.6 Hz, respectively. When inserting these values in Eq. 2 for 10 ms of signal duration, it can be seen that each pair of radios have phase rotation with respect to each other of around 10.1 rad, implying more than 180° change in phase. In this particular study, the random phase noise $\Delta\psi_{PLL}^{ij}(t)$ is negligible because the SDR effectively minimizes it with help of a low-noise clock generator ADF4001 and AD9361 integrated frequency synthesizer.

The wired Ettus Octoclock or a GPS disciplined reference solves by providing separate inputs for the 10 MHz carrier and PPS rising/falling edge signals that aid in time and phase synchronization. Although the Octoclock limits the separation between antennas due to the requirement of direct physical connection, it can be used as a benchmark: one of the design goals of RF clock is to perform as close as possible to the Octoclock. COTS GPS clocks, such as GPSDO, cost over 1K USD per unit, do not work as well in indoor environments, and suffer from intermittent link outages with satellites. AirShare solves carrier frequency synchronization and carrier phase synchronization and relies on a software solution SourceSync for time synchronization. SourceSync requires a specific method of beamforming with customized wait times to achieve symbol level timing synchronization. Mega-MIMO tackles carrier frequency synchronization and carrier phase synchronization, but also uses a custom MIMO approach for synchronizing the phase of distributed transmitters. Similarly, AirSync requires continuous RF carrier tracking and compensation for phase rotation during ongoing application to solve carrier frequency synchronization, time synchronization, and carrier phase synchronization. Pulsar solves time synchronization but requires an atomic clock source. To the best of our knowledge, no prior work addresses all three of carrier frequency synchronization, time synchronization, and carrier phase synchronization in a wireless environment without dependency on a specific MAC layer/application.

The RF clock disclosed herein advances the ability of wireless clock distribution through three functional blocks:

1) Low power front-end design: the RF clock leader transmits a two-tone frequency signal at $f_1$ and $f_2$ over the air, separated by the desired input clock frequency (typically, 10 MHz), similar to AirShare. However, different from AirShare, the RF clock follower extracts the envelope of the transmitted signal and passes it through a customized filtering process to obtain the reference clock. Thus, all nodes have the same LO drift, as they are locked to a common reference, and do not lose synchronization even if there is a drift in the frequency in the leader's clock. At the follower, the RF clock's envelope detector measures the beat frequencies $f_2-f_1$ and $f_2+f_1$. The difference frequency $f_2-f_1$ is then derived to provide the desired virtual LO of 10 MHz that drives the receiver's phased locked loop (PLL). RF clock's front-end derives the 10 MHz signal with ultra-low power, passive, off-the-shelf components, consuming only 6.6 µW.

2) Interference-mitigating clock distribution: In practical interference conditions, the PLL may lose its lock with the reference. For lengthy interruptions, the RF clock has a frequency-agile architecture that allows us to dynamically select $f_1$ and $f_2$, to avoid the spectrum prone to interference. It allows for optimizing the matching filter of the RF front-end, which ensures extraction of the 10 MHz/1 PPS reference remains uninterrupted. For minor interruptions, the RF clock includes a holdover circuit that stores up to 120 seconds of historical frequency data, which is then extrapolated to obtain the clock signal. the RF clock is resilient in multipath scenarios where the follower may receive multiple delayed versions of the signal. Furthermore, in unstable environments, unpredictable phase changes introduce jitter at the clock edges. the RF clock mitigates this problem by setting the optimized value of the digital loop filter bandwidth of the phased locked loop (PLL) to carefully tradeoff signal fidelity with phase noise.

3) Accurate time/phase estimation: In addition to the 10 MHz reference, each radio requires a PPS signal to perform processing tasks at the same time. However, even if all the devices have their LO driven by the reference clock frequency, there can still be phase difference between clock edges. Thus, any time offset between PPS edges for individual RF clock followers needs to be compensated. The RF clock includes a clock alignment algorithm and an auxiliary correction mechanism to increase resiliency, which selects inputs from a cheap, off-the shelf GPS module and/or ultra-wide band (UWB) module. Whenever GPS signal is available, the followers correct their individual time offsets with respect to this global PPS reference. In GPS denied environments, the RF clock receivers use UWB ranging to produce high-resolution timestamps (with pico-second precision) and estimate phase offset with respect to the RF clock leader. This eliminates explicit pair-wise messaging.

The self-synchronizing SDR contains two hardware interfaces to connect MIMO antennas for sub-6 GHz and synchronization antenna by using 50-ohm SMA connector with low attention.

A customized MIMO SDR is small form factor and extremely light (e.g., 8 gram) software-defined radio which has integrated wideband RF transceiver and runs Linux operating system. RF transceiver IC on MIMO SDR supports independent transmission and reception of RF signal at different frequencies between 70 MHz to 6 GHz. Additionally, the RF transceiver integrated circuit contains internal 12-bit analog-digital-converter and digital-analog-converter that provide configurable A/D and D/A sample rates up to 61.44 Msamples/sec. FPGA based integrated Linux computer on customized MIMO SDR allows the self-synchronizing SDR to execute necessary signal/protocol processing without a host computer including GNURadio blocks and software controller modules. The proposed SDR provides two SMA jack connectors for the Rx interface and two SMA jack connectors for Tx interface. The external reference clock can be utilized by using external clock input pin.

The customized MIMO SDR interfaces with AI and Controller module through UART and SPI connection to transmit/receive information sent to central coordinator and QSPI flash memory.

The present disclosure is a RF-based over-the-air synchronization system for COTS SDR devices that enables time, frequency, and phase synchronization of these radios' application-specific operations with respect to each other.

This sync system includes a leader who emits the combination of two-toned signal for its followers to extract intended clock frequency and orchestrates the timing synchronization by exchanging pair-wise messaging, multiple programmable followers who obeys the leader's rules and extract the envelope of the received two-tone signal with additional processing steps as reference clock and applies time alignment according to message-exchange process, and multiple programmable radios, acting as either transmitter or receiver based on the implemented application, that are interfaced with RF clock leader and followers to enable synchronization among them.

This technology includes modules such as low-power front-end design to ensure frequency synchronization with low-power and passive components, interference-mitigating clock distribution to enable dynamically selection of two-tone signal to avoid the spectrum prone to interference, and highly accurate time/phase estimation to correct individual time offset of each follower with respect to leader with clock alignment algorithm and time correction mechanism.

The sync system described in the present technology provides distributed timing and clock synchronization for large scale radios while eliminating the need of wired synchronization, which is a bottleneck for the applications, and make the devices operating in limited ranges, and decoupling the synchronization operation from the underlying MAC/APP protocol, which makes RF clock not dependent and standalone platform that is highly programmable with multiple interfaces.

The application of this technology may include (not limited) to integrate with intelligent reflector arrays to create smart surfaces, distributed coordinated beamforming, aerial communication, Internet of Things (IoT) and interfacing with COTS radios to enable these applications.

Referring now to FIG. 1, system architecture and components for a self-synchronizing SDR system 100 can include a plurality of MIMO antennae 101 and synchronization antennae 103 for receiving and transmitting signals from the self-synchronizing SDR 100. In some embodiments, the MIMO antennae 101 can be connected via SMA connectors to interface the MIMO and synchronization antennas, however, it will be apparent in view of this disclosure that any suitable connector(s) can be used in accordance with various embodiments. The self-synchronizing SDR system 100 can also include a customized MIMO SDR 105 having signal conditioning components suitable for performing full demodulation and modulation of both incoming and outgoing signals. For example, as shown in FIG. 1, such components can include power amplifier/low noise amplifiers (PA/LNA) 105A, front end components 105B including analog to digital converters (ADC) and digital to analog converters (DAC), and/or a processing device 105C. In addition, the self-synchronizing SDR 100 can include one or more timing and frequency synchronization modules (e.g., follower sync module 107a, leader sync module 107b, and mesh networking module 107c. Operations within the self-synchronizing SDR 100 can generally be coordinated by an AI and Controller unit 109, which can include a processor 111 and memory 113.

Figure 2:
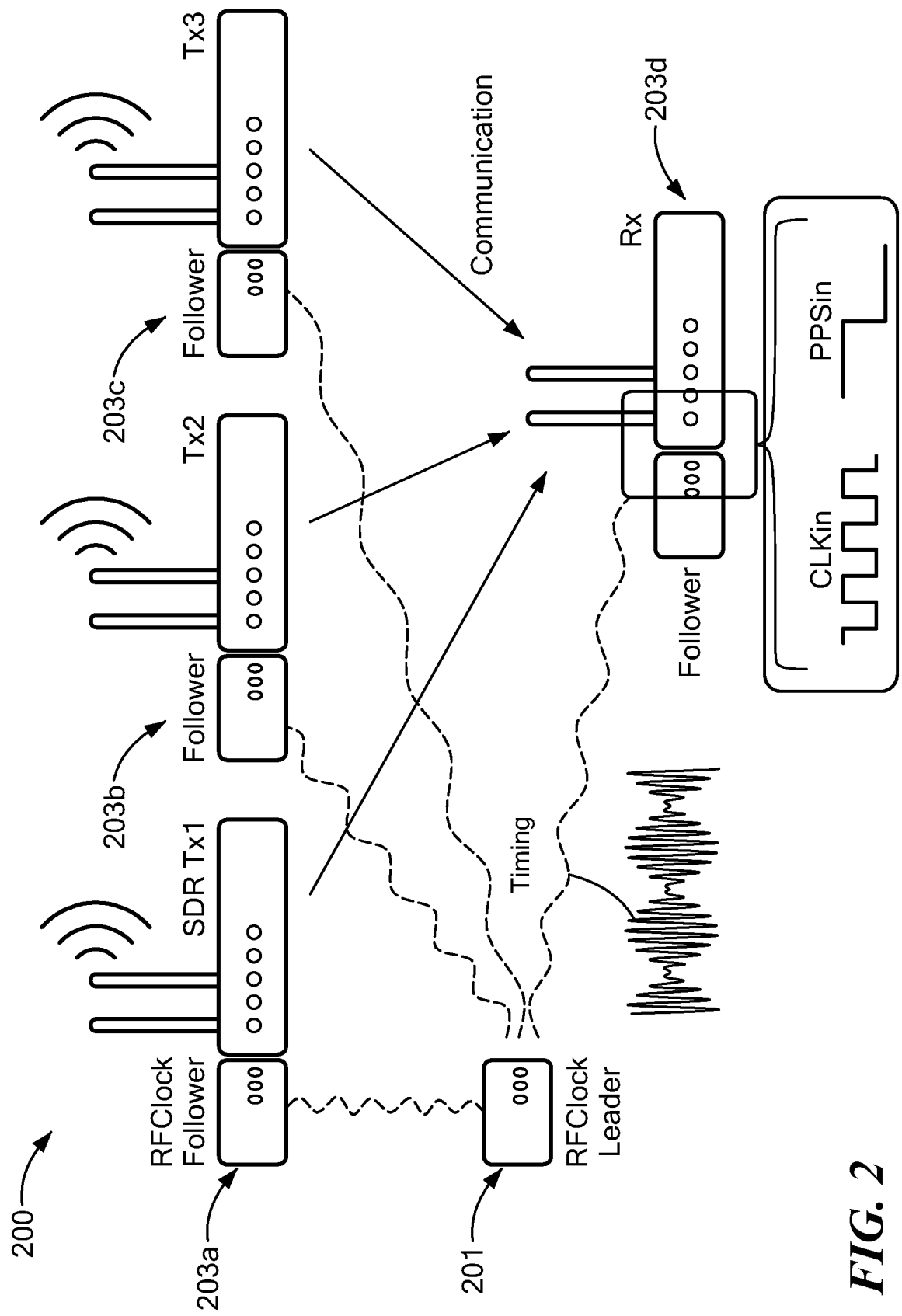
FIG. 2 is a diagram of network architecture showing the distributed timing enabled by the timing, phase, and frequency synchronization system ("RF clock").

FIG. 2 illustrates network architecture showing the distributed timing enabled by the timing, phase, and frequency synchronization system ("RF clock") 200. Generally, as noted above, the RF clock 200 follows the leader-follower model, with the leader generating the reference clock that is distributed to all followers. By this design, the RF clock is configured to provide carrier frequency synchronization that overcomes clock frequency offsets and locks each device to the same reference frequency, timing synchronization so that each device can perform the desired action at coordinated intervals, such as the rising/falling edge of the clock, and carrier phase synchronization, so that clock signal arrives with the same phase for all followers.

The RF clock 200 uses a leader-follower model, with the leader 201 generating the reference clock that is distributed to all followers. The RF clock 200 is designed to provide carrier frequency synchronization that overcomes clock frequency offsets and locks each device, leaders 201 and followers 203a, 203b, 203c, 203d, to the same reference frequency, timing synchronization so that each device 201, 203a-d can perform the desired action at coordinated intervals, such as the rising/falling edge of the clock, and carrier phase synchronization, so that clock signal arrives with the same phase for all followers.

FIGS. 5A-5D illustrate the effect and impact of CFO and timing error. If each SDR in a distributed antenna system generates its RF carrier signal from a separate LO, the receiver is exposed to multiple CFOs. In addition, multiple signal streams arrive at the receive antenna from the transmit antennas at different instances, giving timing misalignment. These effects are explored in a testbed using an Orthogonal Frequency Division Multiplexing (OFDM) modulated waveform, which is commonly used in 802.11 a/g/n, WiMax, and LTE. OFDM is very sensitive to frequency offset and timing errors that cause inter-symbol interference (ISI) and inter-channel interference (ICI).

Figure 5A:
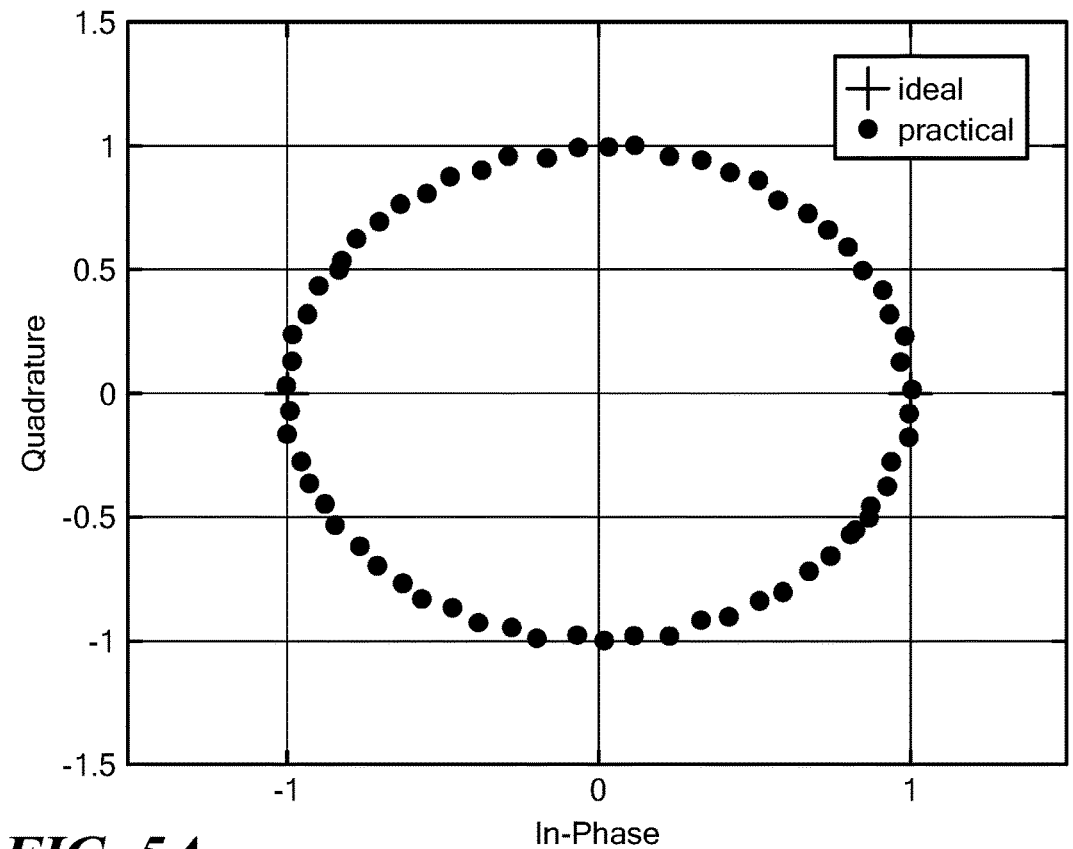
FIGS. 5A-5D illustrate the effect and impact of CFO and timing error.
Figure 6:
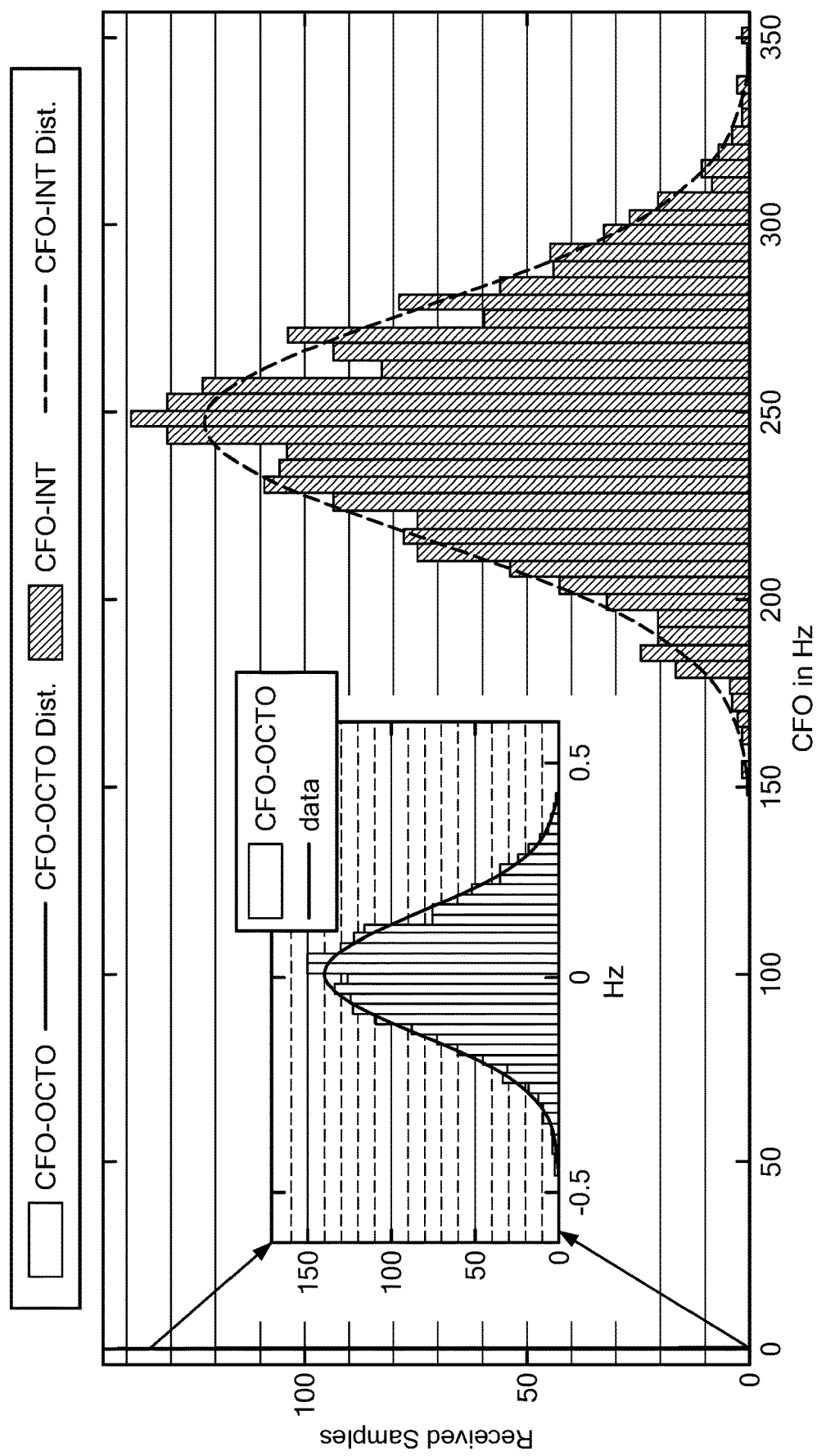
FIG. 6 illustrates the impact of Octoclock on the CFO for a transceiver-receiver pair.

CFO Estimation: For a single input single output (SISO) link, the relationship between received signal y(t) and transmitted signal x(t) is $y(t)=h(t)x(t)+z(t)$ where received symbol y(t) is impacted by the channel h(t) and additive Gaussian noise z(t). The received symbol becomes $y(t+\tau)e^{\{j(\phi\_\{clk\}^j(t))\}}$ due to lack of synchronization, where $\tau$ represents timing misalignment and $\phi_{clk}^j(t)$ the instantaneous phase difference derived earlier in Eq. 2. Sampling clock phase offset and sampling clock frequency offset during one symbol period are ignored as their effect is not significant To obtain the CFO between pairwise SDRs, 802.11a-compliant OFDM frames are generated in MATLAB and transmit them over the air. The method that performs coarse and fine frequency offset estimation using short (STS) and long training sequences (LTS) is used. FIG. 6 shows the observed CFO, where the main plot describes the case of only using internal clocks without any CFO correction. The plot in the inset contrasts this with the case where the Octoclock is the external shared clock. Thus, when the B210 SDRs operate with their internal clock, their CFO is in the range 150-350 Hz, whereas the CFO with Octoclock is in the range 0-0.5 Hz. This corresponds to an average ratio of 0.2 ppb (parts per billion). Due to the CFO arising from the internal oscillators of SDRs, the points on the constellation diagram keep moving along the unit circle in the same direction, as shown in FIG. 5A. This is a marked deviation from the expected and ideal BPSK constellation.

Figure 5B:
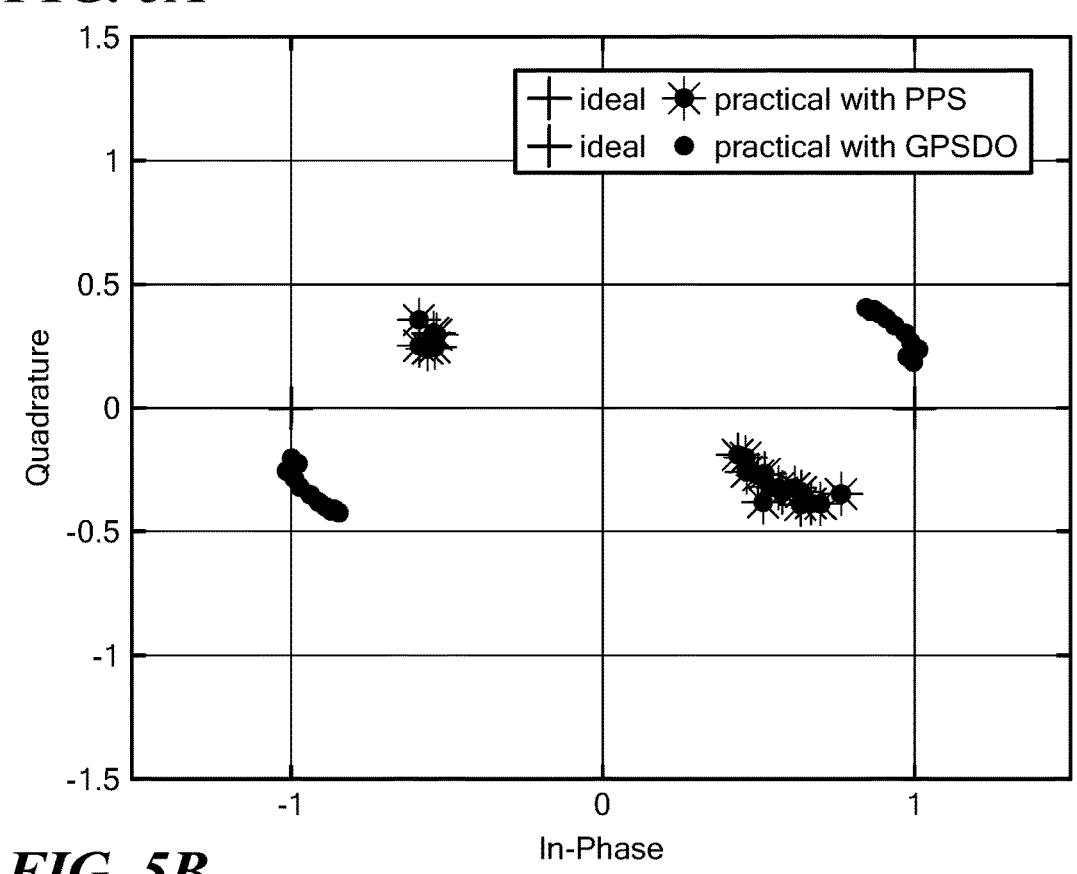
Figure 5C:
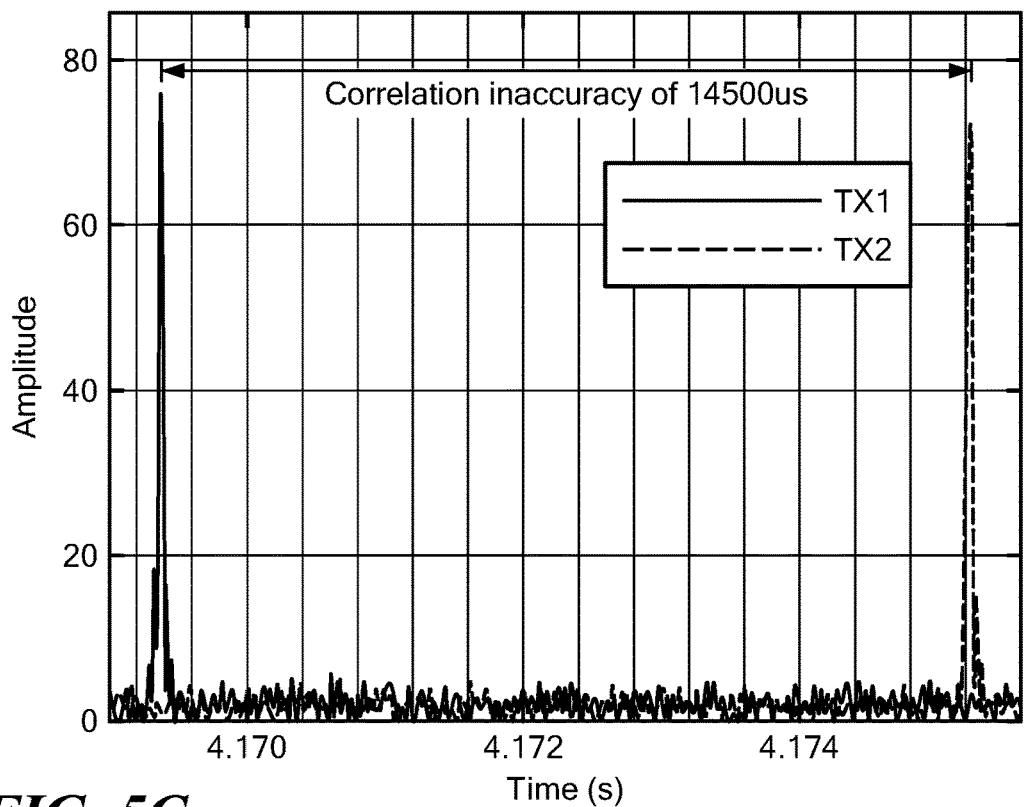
Figure 5D:
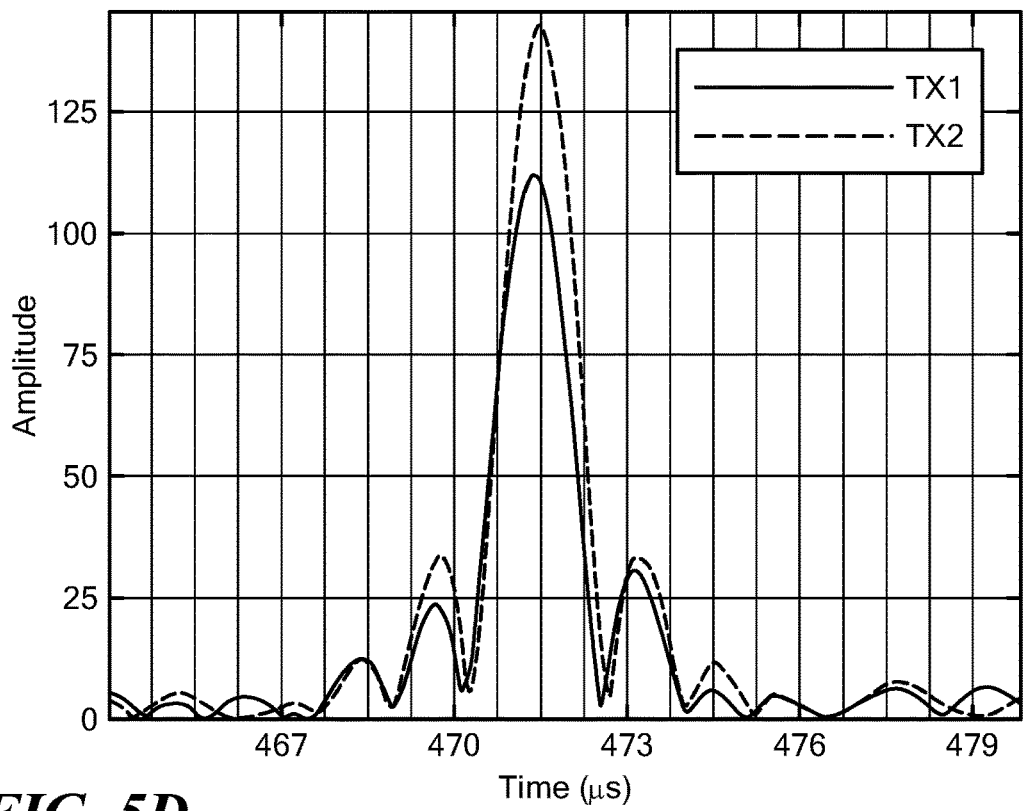

Effect of Timing Error in DCB Application: Apart from the external clock, SDRs require a PPS signal for their operation. The clock signal (typically 10 MHz) is used to drive the digital and analog circuits of the RF front-end and the PPS signal is used to control the synchronized operation. Note that due to variable latency in the link between RF front-end and the host computer, software-only synchronization is not precise. Thus, the RF clock is designed as a stand-alone hardware solution to achieve time synchronization in the order of nanoseconds. To observe the effect of timing error between multiple radios in a DCB application, an experiment is conducted with 3 USRP B210 radios, with two of them as transmitter and one as the receiver. Each transmitter generates a frame with predefined Gold sequence as training symbol, followed by the same OFDM blocks encapsulating BPSK modulated symbols with proper zero-padding and cyclic prefix (CP) insertion. All SDRs are connected to an Octoclock that provides the 10 MHz reference and eliminates CFO error. However, these disconnected SDRs must perform processing tasks on samples aligned in time, i.e., at the same sample clock edge for correct DCB. The DCB implementation is straightforward: a channel state feedback process is introduced that exploits statistical knowledge of channel characteristics by (i) correlating the incoming samples against the stored Gold sequences to detect an individual transmitter, and then (ii) performing Least Squares (LS) estimation to estimate the channel. The receiver updates the transmitters with the beamforming weight vector w every 50 ms, a limitation posed by GNURadio as it must pause for this time to avoid buffer overflow. The transmitted symbols s[m] are multiplied by the beamforming weights to construct the new signal x[m]=$\sqrt{E_s}$w$^H$s[m], where $E_s$ is the average energy of the transmitted signal x[m] with normalized constellation symbols at any instant m. Even with perfect software-based time co-ordination among transmitters, the starting point of two copies of same OFDM symbol from different transmitters may not coincide with the exact timing of receiver FFT window. This affects the correlation of training symbols from distributed transmitters, an example of which is shown in FIG. 5C. An inaccuracy of 14500 µs is observed between the cross-correlation peaks from the two transmitters. This results in the PPS edges being misaligned, causing a mismatch in the phase synchronization. The resulting rotation in the constellation points at the receiver is shown in FIG. 5B. With PPS alignment, this issue can be resolved, the result of which can be seen in FIG. 5D, where, with accurate cross-correlation of training signals, the correlation peaks get aligned within 1 µs. Issues with GPS synchronization is also studied by repeating the experiment outdoors with two USRP B210 SDRs paired with the Ettus GPS disciplined oscillator (GPSDO) that provides the 10 MHz clock and PPS signal. It can be observed that the relative time error (TE) between two GPSDO-sourced PPS is ±500 ns. However, the relative phase drift between two clock outputs of GPSDOs is not stable, varying between 0-100 ns, whose adverse effect is seen in the constellation diagram at the receiver-side (see FIG. 5B).

Prototype Hardware

Figure 7A:
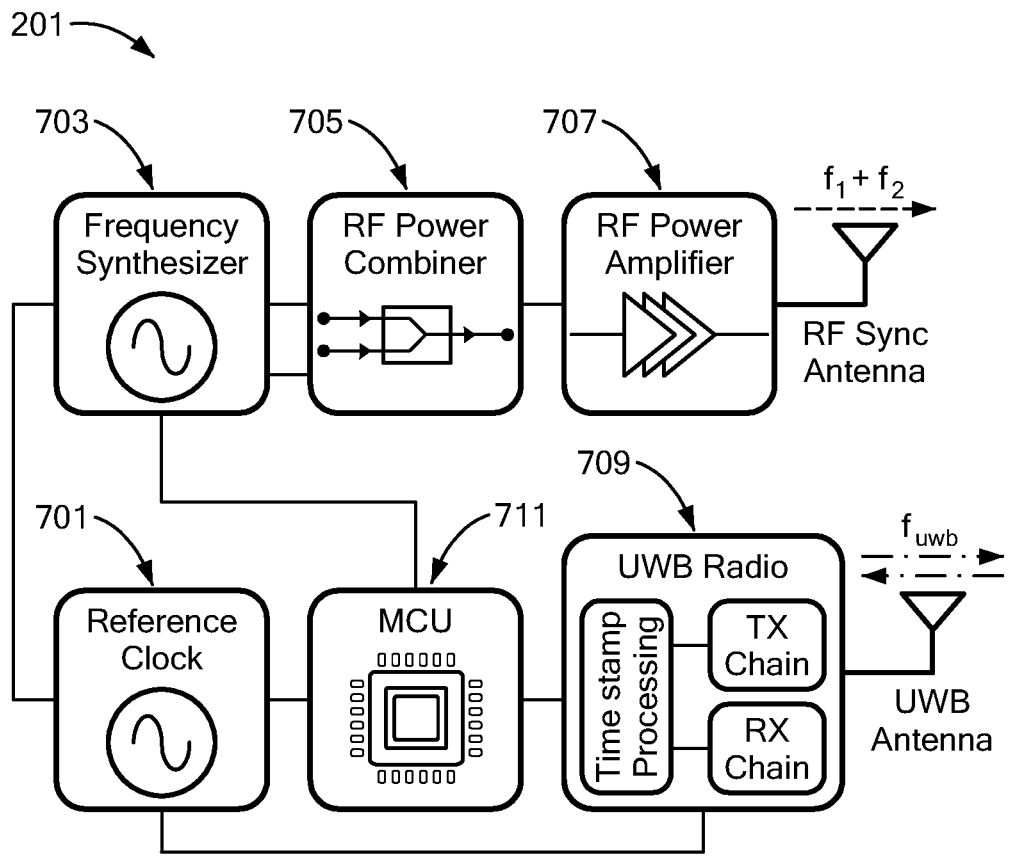
FIGS. 7A-B illustrate the functional composition of the RF clock leader and follower.
Figure 7B:
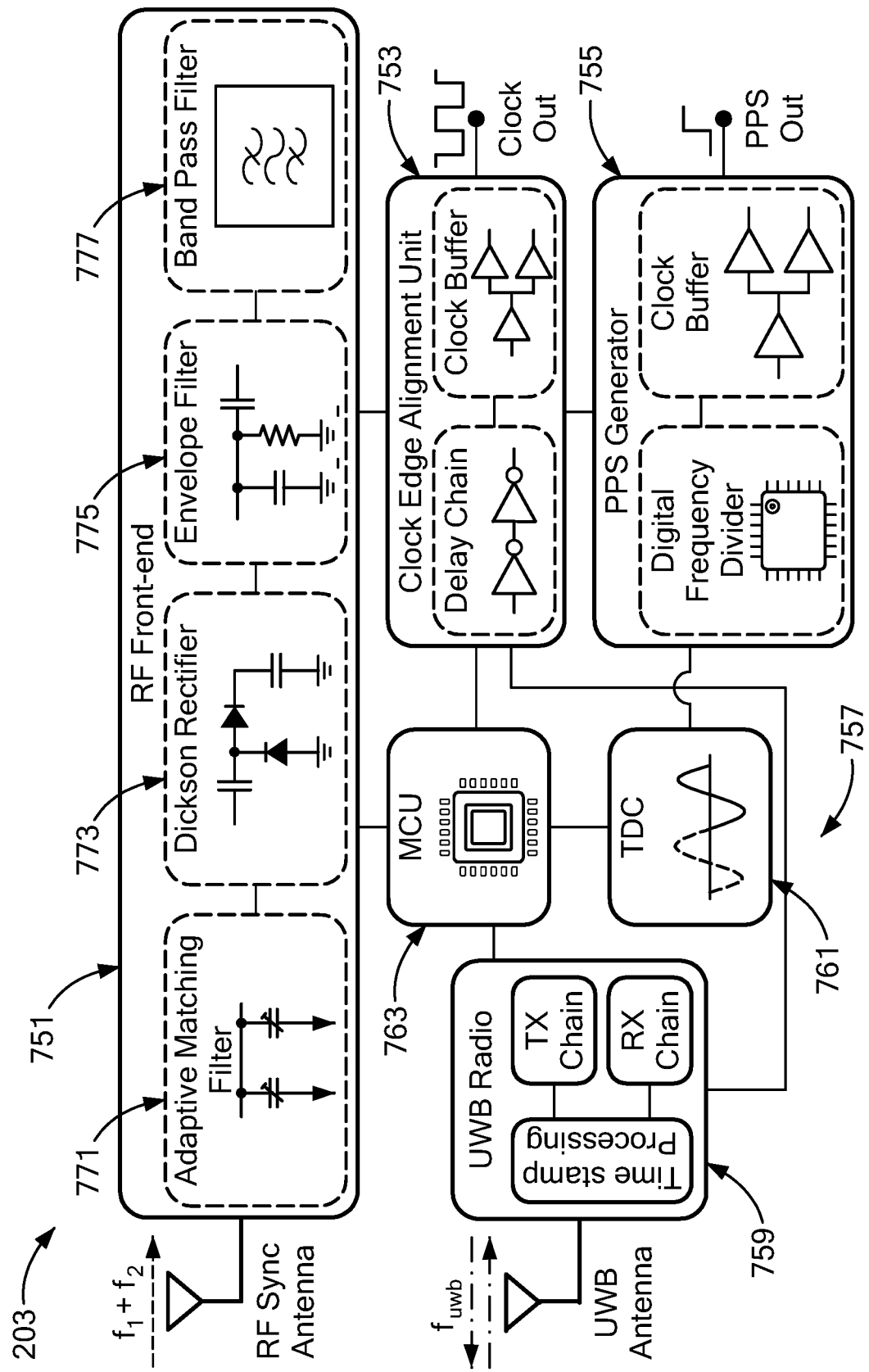
Figure 8:
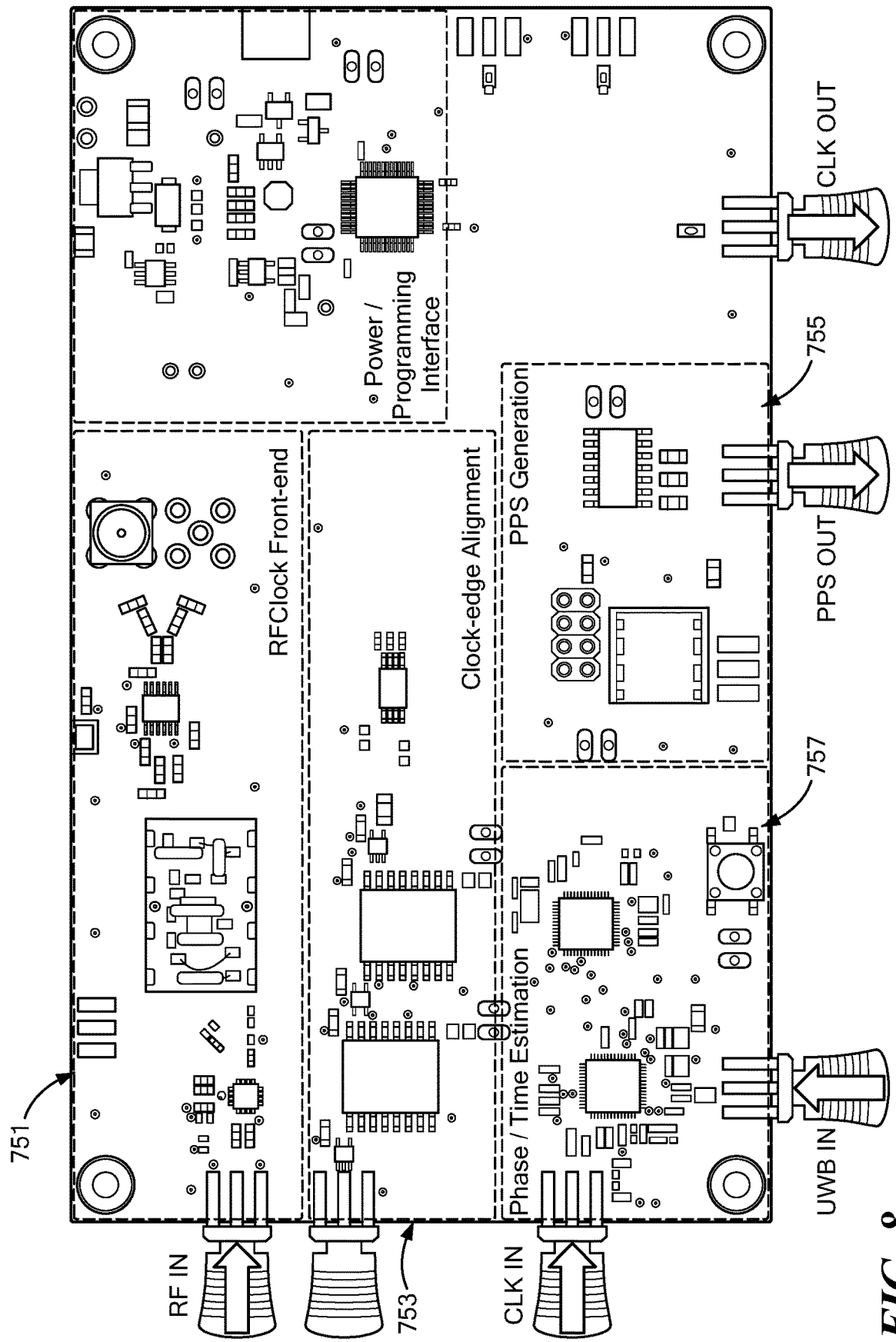
FIG. 8 illustrates the RF clock follower implementation with custom designed components.
Figure 9:
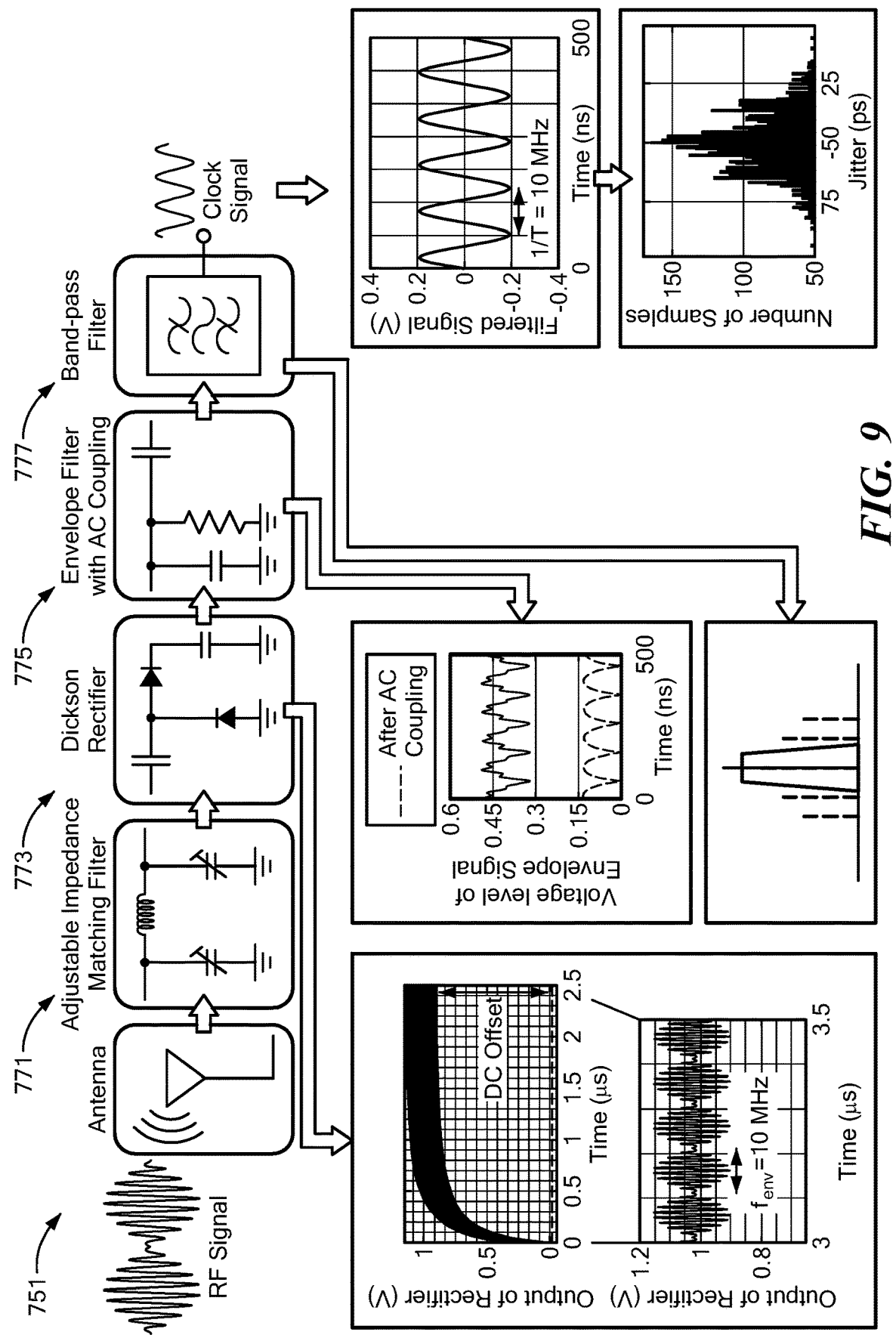
FIG. 9 illustrates the functional composition of the RF clock front-end performs reference clock extraction.

FIGS. 7A-7B illustrates the functional composition of a prototype RF clock leader 201 and follower 203. The RF clock leader includes a reference oscillator 701, a RF frequency synthesizer 703 that locks to reference oscillator to produce two-tone signal at desired frequency $f1+f2$, a RF power combiner 705 and amplifier 707 used to combine the two-tone signal and transmit over-the-air, a UWB radio IC 709, and a microcontroller 711 (e.g., an ARM-Cortex) that orchestrates all RF clock functions. The follower 203 is illustrated in FIG. 7B (see also FIG. 8) and includes a RF clock front-end 751, a clock-edge alignment unit 753, a PPS generator 755, and phase/time estimation circuitry 757, which, in some embodiments, can include a UWB radio IC 759, a time to digital converter (TDC) 761, and a microcontroller 763 that orchestrates all RF clock functions. Generally, the RF clock front-end 751 (see also FIG. 9) can include passive resistors, capacitors, and diodes. As shown in FIG. 7B, the RF clock front-end 751 can include an adjustable impedance matching filter 771 composed of a digital capacitor array to allow flexible tuning of desired frequencies, a 4-stage rectifier 773, 775 composed of Schottky diodes extracts the envelope, and a band pass filter 777 with a center frequency of 10 MHz is provided for the extracted clock signal to pass through. The envelope output drives a low jitter phase-locked loop (PLL). One output of the PLL is connected to the microcontroller 763 to produce a 1PPS signal. The phase difference between 10 MHz/38.4 MHz and the local PPS is measured using the time to digital converter (TDC) 761. The UWB radio module 759 is responsible for estimating phase offset (ΔTpps), which has capability of time-stamping the transmission and reception of packets with a resolution of 15.65 ps. The microcontroller 763 synchronizes clock edges with estimated phase offset through the delay chain composed of cascaded multiple 8-bit timing elements that allows delays up to 100 ns. Finally, power consumption of front-end design is 6.6 µW, while the energy consumed for a single UWB ranging operation is 0.159 µJ.

To extract reference clock signal, let $x_1(t)=Ae^{j2\pi f_1 t}$ and $x_2(t)=Ae^{j2\pi f_2 t}$ be two single tone sinusoidal signals of amplitude A at frequencies $f_1$ and $f_2$, respectively, which are combined by the leader. Therefore, the transmitted two-tone signal is $S_{tx}(t)=A\Sigma_{k=1}^{2}e^{j2\pi f_k t}$. This superposition of waves can be written as a function of the sum and difference of the frequencies $f_1$ and $f_2$, $$S_{tx(t)} = 2\cos(2\pi((f_1 - f_2)/2)t)e^{j2\pi\left(\frac{f_1+f_2}{2}\right)t}$$

One part is a quadrature signal which oscillates with the average frequency $$f_{diff} = \frac{f_1 - f_2}{2},$$

The other part is a cosine wave which oscillates with the difference frequency $$f_{avg} = \frac{f_1 + f_2}{2}.$$

as if it were the modulator signal controlling the envelope of the resulting wave. As the envelope crosses the zero mark twice in every period, the envelope frequency is twice the difference frequency. This is given by the magnitude of the difference of the two frequencies as $f_{env}=|\theta_1-f_2|$. This is the reference clock signal $f_{clk}$ that is extracted at the RF clock follower through a suitably designed envelope detector. As the two-tone signal $S_{tx}(t)$ propagates over the wireless channel, the received version at the follower $S_{rx}(t)$ can be expressed as:

$$S_{rx}(t) = A\left[\alpha_1 e^{j(2\pi f_1 t+\phi_1^{ch})} + \alpha_2 e^{j(2\pi f_2 t+\phi_2^{ch})}\right]$$

where $\alpha_1$ and $\alpha_2$ are signal attenuation constants, and $\phi_1^{ch}$ and $\phi_2^{ch}$ represent phase change of the signals due to the wireless channel. This received signal is given to an envelope detector that outputs the full-wave signal $S_{env}(t)$ at frequency $f_{clk}$, which is the envelope of the quadrature signal as discussed earlier.

$$S_{env}(t) = A\left|\alpha_1 e^{j(2\pi f_1 t+\phi_1^{ch})} + \alpha_2 e^{j(2\pi f_2 t+\phi_2^{ch})}\right| \quad (1)$$

The equation above is rewritten as a voltage-shifted version of the modulator signal at frequency $f_{clk}=|f_1-f_2|$asA{2 $(\alpha_1^2+\alpha_2^2)+2\alpha_1\alpha_2 \cos (2\pi(f_1-f_2)t+(\phi_1^{ch}-\phi_2^{ch}))$}$^{1/2}$. The first term is a DC component that is filtered out with a band-pass filter centered at $f_{clk}$. All the RF clock followers now have the same drift as they are locked to a common RF clock leader.

If there are L independent propagation paths for the reference tone, with the first arriving signal taking the direct path, then the received signal at a given follower is the summation:

$$S_m(t) = \left| A \sum\nolimits_{m=1}^{L} \alpha_m \left\{ \sum\nolimits_{k=1}^{2} e^{j(2\pi f_k t)} \right\} e^{j\phi_m^{ch}} \right|.$$

Here $\alpha_m$ and $\phi_m^{ch}$ are the attenuation and phase shift for the $m^{th}$ path, respectively. For simplicity, it is assumed that tones have 0 initial phase, then the corresponding envelope of this signal is obtained from equation 1 as:

$$S_m(t) = A \left\{ 2 \sum_{m=1}^{L} a_m^2 [1 + \cos(2\pi(f_1-f_2)t)] + \sum_{m=1}^{L} \sum_{n=1}^{L} \alpha_m \alpha_n \left[ \cos(2\pi(f_1-f_2)t - \Delta\phi_{mn}^{ch}) + \cos(\Delta\phi_{mn}^{ch}) \right] \right\}^{1/2}$$

In a multipath environment, the extracted beat frequency $|f_2-f_1|$ remains the same. However, in dynamic environments or due to relative motion, the extracted frequency at the follower may shift due to change in the phase offset $\Delta\phi_{mn}^{ch}$ between, say, the $m^{th}$ and $n^{th}$ path. This introduces random perturbations called jitter in the clock's signal edges. The PLL in the follower has a digitally controlled loop filter that increases the amount of jitter attenuation at such times by reducing the loop filter bandwidth.

Figure 10A:
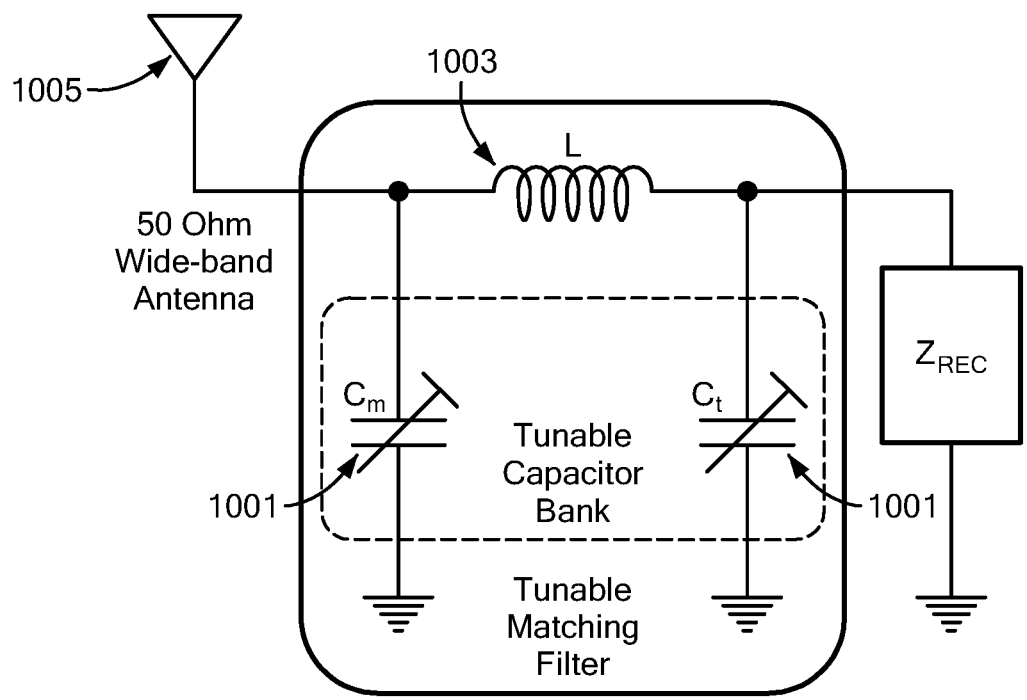
FIGS. 10A-B illustrate a tunable filter design showing H filter network with tunable capacitors and inductors.
Figure 10B:
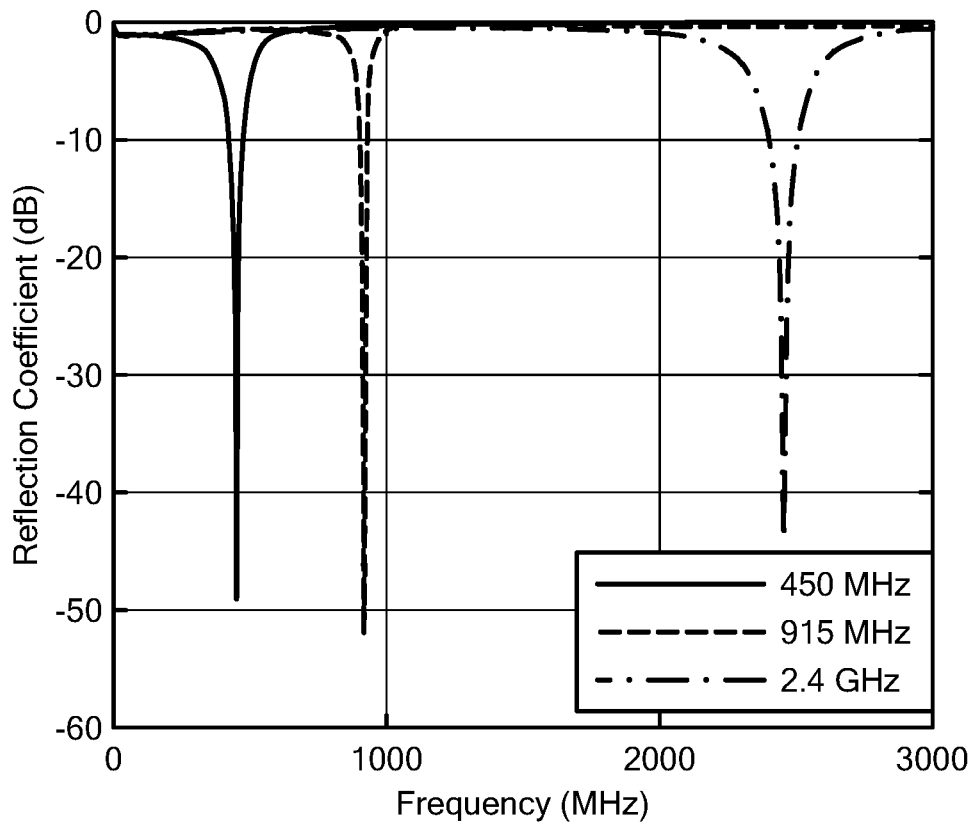

The RF clock's operation can be impacted by an interfering RF signal, with the resulting link disruption causing (i) an increase in CFO at the follower, or (ii) the follower PLL to lose its lock with the leader. To mitigate this, a tunable matching filter is designed that allows the RF clock to switch between frequency bands. FIG. 10A shows the filter 1000 topology including of digital tunable capacitors 1001 and inductors 1003 arranged in a Π network. The tunable filter is optimized for different center frequencies with 10 MHz bandwidth, as shown in FIG. 10B. Center frequency is adjusted by changing capacitance $C_m$ while inductor L is kept constant. Capacitance $C_t$ is used for matching the filter to load and source impedance, which are the RF front-end input and antenna impedance, respectively. The exemplary filter 1000 illustrated in FIG. 10A is optimized for 900-910 MHz and 1800-1810 MHz, which was chosen because the antenna 1005 supports dual bands. However, it will be apparent in view of this disclosure that any frequency target can be selected in accordance with various embodiments and as supported by the antenna hardware.

Figure 11:
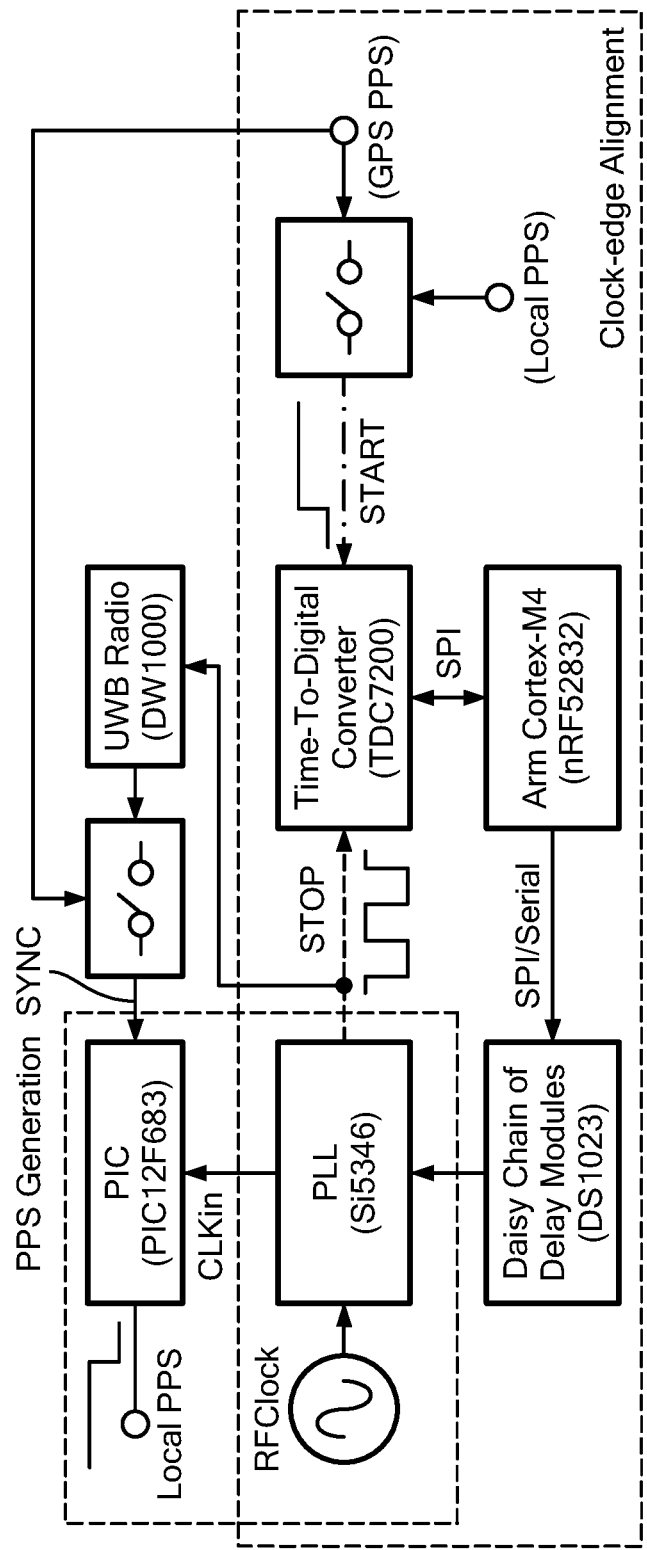
FIG. 11 illustrates the functional composition of the RF clock PPS generation and clock-edge alignment.

FIG. 11 illustrates the functional composition of RF clock PPS generation and clock-edge alignment. The frequency synchronization compensates for clock drift, allowing all followers to track the frequency of the leader. However, there may still be a phase difference between their respective clock edges because signal propagation time for leader-follower pairs may vary. The RF clock includes a PPS module, which generates a uniform stream of pulses derived from the RF clock's front-end output (i.e., every 100 ns at the reference frequency of 10 MHz). However, the PPS generation must have a common origin for all followers, and in absence of such a synchronized start or correction, the difference between PPS trigger instants can grow rapidly. Thus, it is needed to (i) compensate the phase offset $\Delta T_{PPS}$ between PPS edges of different nodes at a hardware level (called as phase synchronization); (ii) establish a common origin to start the PPS generation (called as time synchronization); (iii) include a recovery mechanism when synchronization fails. To overcome above challenges, the hardware and software components are designed such as: 1) RF clock front-end (see FIG. 8), 2) Phase-locked loop, 3) Time-to-Digital (TDC) converter, 4) PIC microcontroller, 5) ARM (Cortex M4) processor, and 6) a daisy chain of delay modules. The end-output of this block is a 1PPS signal, phase locked to the 10 MHz clock and also phase synchronized across the entire network of nodes. To obtain a stand-alone PPS signal, a digital frequency divider (DFD) is implemented within the PIC controller. It takes as input the signal generated by the PLL port, which in turn is phase locked to the RF clock envelope detector output signal at 10 MHz. The PIC then executes the DFD code custom written in assembly language, where each instruction requires one processor clock cycle to execute. Thus, it takes 2.5M instruction cycles to derive an exact measure of 1 second. This generates a stream of pulses with a fixed pulse width of 200 ms corresponding to %20 duty cycle, which is standard for most commercial PPS generators, such as the Octoclock. The dedicated microcontroller avoids time jitter as it is not interrupted by other real time operations of the ARM processor. To measure the precision of the PPS spacing in time, 10K pulses are exported and calculate the time difference is calculated between successive rising edges. The maximum and minimum values of the period jitter are within ±80 ps, and the RMS (root-mean square) of the period jitter is 20 ps. This remarkably low jitter is visually depicted in FIG. 9.

PPS alignment with GPS involves an ARM processor to perform these tasks: i) as part of an initialization step, it resets and syncs the system PPS with a global source PPS, ii) it tracks phase differences between the internally generated and external triggers at each PPS edge, and iii) it adjusts the clock edges according to, $\Delta T_{pps}$, through a delay chain. Specifically, the clock-edge alignment module has a synchronization line (SYNC) that resets the time-base for PPS generation. The SYNC pin is only read at the next rising edge of the 10 MHz clock. This introduces up to 100 ns of error unless the source driving the SYNC line is phase aligned with the 10 MHz clock. Therefore, this method only allows an offset correction within a maximum 100 ns error margin. To estimate the residual error, the phase error is measured between the GPS PPS input and the next positive edge of the 10 MHz clock by using a time-to-digital converter (TDC). The TDC measures the phase between the PLL-generated pulse derived from the 10 MHz envelope detector that arrives at its STOP pin and the other 1PPSpulse stream arriving on the START pin, with a resolution of picoseconds (see FIG. 11). The output of the TDC is used by the ARM processor to activate the delay chain with the estimated phase error to align the clock edge to the global PPS edge. This feedback loop controls the PLL (and in turn the PIC's PPS output) by adjusting the delay element using the output from TDC measurements.

Figure 12:
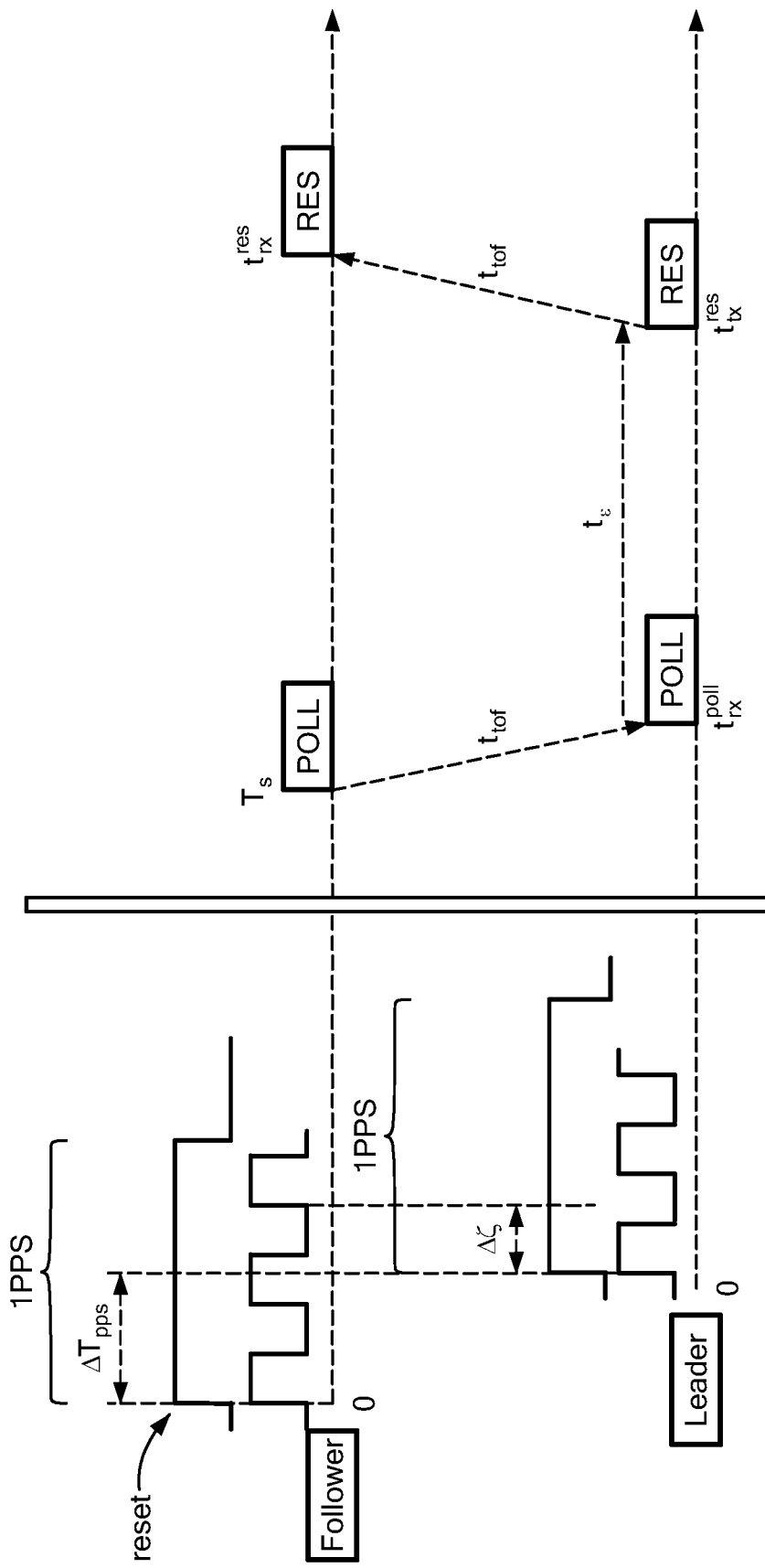
FIG. 12 illustrates UWB-based PPS alignment of RF clock.

FIG. 12 illustrates PPS alignment with UWB ranging of the RF clock. Since GPS requires line-of-sight to satellites and works best outdoors, the RF clock incorporates an auxiliary UWB-based message exchange protocol for both GPS-available and GPS-denied environments. The start is from the point where the RF clock leader and follower have their respective rising edges of the PPS separated by $\Delta T_{PPS}$, although they have no relative carrier frequency offset. The UWB module in the follower sends a POLL message to the leader and records the local time Ts. The leader records the reception time of POLL message at $t_{rx}^{poll}$ local time, takes an additional $t_e$ to initiate the reply, and then sends out a RESPONSE (RES) message at local time $t_{tx}^{res}$. Both the times $t_{rx}^{poll}$ and $t_{tx}^{res}$ are included in the payload of the res message. these timing relationships can be expressed as:

$$t_{rx}^{poll} = (T_s - \Delta T_{PPS}) + t_{tof}$$

$$t_{tx}^{res} = (T_s - \Delta T_{PPS} + t_{tof}) + t_\epsilon$$

$$t_{rx}^{res} = T_s + 2t_{tof} + t_\epsilon$$

where, $t_{tof}$ is the unidirectional time of flight. $\Delta T_{PPS}$ from above equation is calculated as follows, $$\Delta T_{PPS} = \frac{(T_s - t_{rx}^{poll}) + (t_{rx}^{res} - t_{tx}^{res})}{2}$$

Here, the controller orchestrates the ranging instructions and gathers error measurements caused by the phase ambiguity between UWB reference clock 38.4 MHz and PPS through TDC and processing delay that changes with each ranging cycle. The processing delay is compensated within maximum of 5 ranging iterations. The residual error (66 ζ) that remains after resetting the local PPS with the estimated phase offset $\Delta T_{pps}$ is finally applied to the delay chain to remove any remaining offset between PPS edges. The timestamps obtained from ranging can be further exploited to provide a common notion of time across the network for simultaneous start of transmissions by all RF clock followers. After all the nodes are phase synchronized and have PPS aligned with respect to the leader PPS, the latter broadcasts a UWB POLL message at time $T_s$. This message helps each follower to estimate the time difference $\Delta T_{offset}$ between leader and itself by using the following equation, $$\Delta T_{offset} = (T_s - t_{rx}^{poll}) - t_{tof}$$

where $t_{tof}$ is the time of flight that is estimated by utilizing timestamps as $[(t_{rx}^{res} - T_s) - (t_{tx}^{res} - t_{rx}^{poll})]/2$.

To coordinate start time for transmission, the time stamps obtained from ranging can be further exploited to provide a common notion of time across the network for simultaneous start of transmissions by all RF clock followers. After all the nodes are phase synchronized and have PPS aligned with respect to the leader PPS, the latter broadcasts a UWB POLL message at time Ts. This message helps each follower to estimate the time difference $\Delta T_{offset}$ between leader and itself. Each SDR uses this offset provided by the RF clock to appropriately schedule the starting instant of its transmission for an application like DCB.

$$\Delta T_{offset} = (T_s - t_{rx}^{poll}) - t_{tof}$$

where $t_{tof}$ is the time of flight that is estimated by utilizing timestamps as $[(t_{rx}^{res} - T_s) - (t_{tx}^{res} - r_{rx}^{poll})]/2$.

Figure 13A:
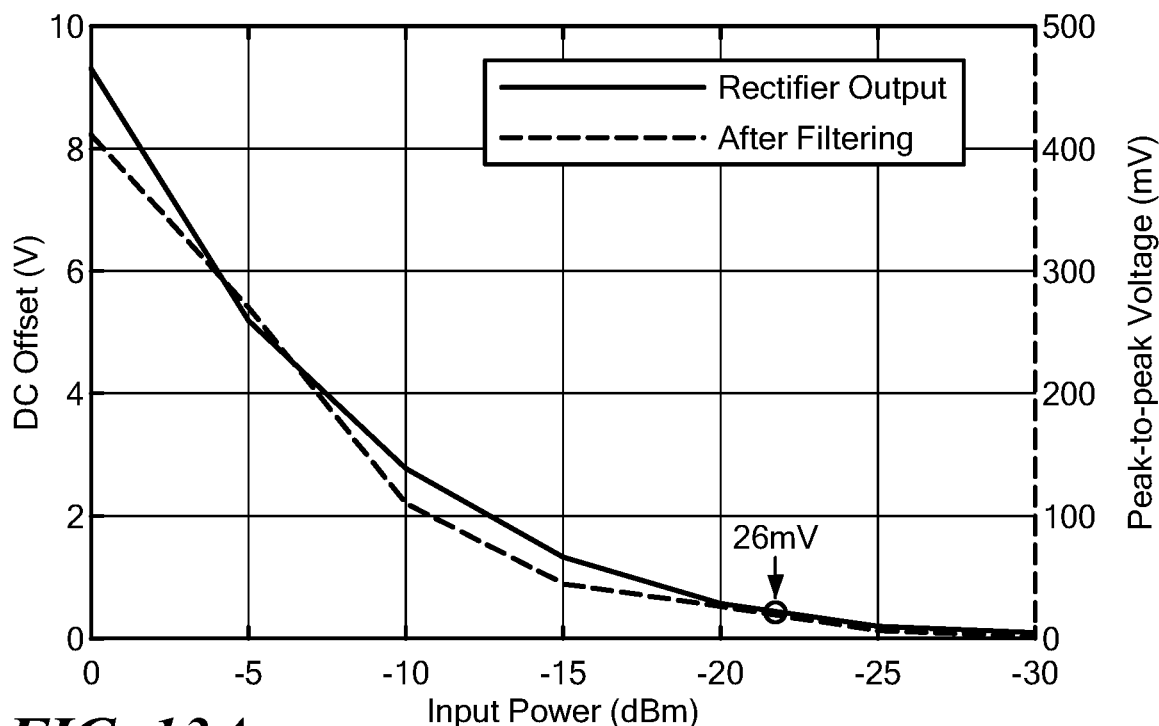
FIGS. 13A-B illustrate the RF clock front-end performance based on input power under a wide range of SINR values and RF clock's coverage range.
Figure 13B:
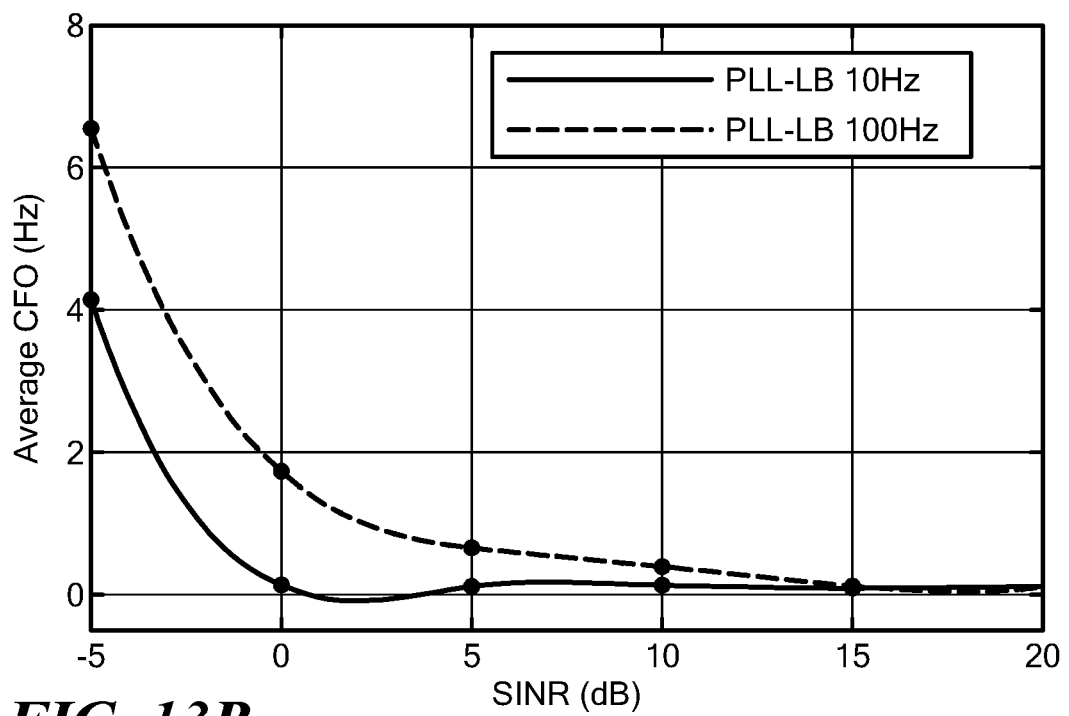

FIGS. 13A-B illustrate RF clock front-end performance based on input power under a wide range of SINR values and the RF clock's coverage range. The maximum coverage range of the system has been obtained with conventional free space path loss (FSPL) between leader and follower. This is done by measuring follower RF sensitivity in terms of front-end design and UWB ranging performance and determining leader transmitted power along with other parameters. FIG. 13A shows the measured peak-to-peak voltage of follower's extracted clock signal versus input power (antenna gain not included). −22 dBm is picked as the front-end sensitivity, which is the minimum required power for our clock recovery mechanism to perform recovery and enable the rest of the system. In addition, the transmitted power of leader at the allowed maximum level is adjusted based on the FCC-imposed limitation of 36 dBm per transmitter in the 900 MHz ISM band. Since the leader transmits two different single tones over the air, the total transmitted power is 39 dBm. It can be observed that the maximum allowable coverage radius is 164 ft for each follower front-end to perform reference clock extraction. By implementing multiple antenna system in leader-side or deploying follower-relay nodes at the edge of the coverage areas, the permissible range of the system can be increased (although not validated herein). Similarly, the regulatory limit for UWB is 41.3 dBm/MHz if frame transmission time is less than 1 ms, which corresponds to total channel power of −14.3 dBm/500 MHz. The UWB parameters are adjusted to increase this upper bound such that using the highest data rate of $6.8$Mbps with preamble length of 128 enables the use of shorter message duration. This results in total frame transmission time of 180μ s. This reduction allows boosting transmitter power to 6.9 dB. The minimum permissible receiver sensitivity of UWB chip is −94 dBm, which can be improved by decreasing clock offset between paired radios. Since our system eliminates this offset by extracting reference clock from the leader's transmission, this lower bound is decreased to −106 dBm. When channel frequency as 3993.6 MHz is considered, the coverage distance of UWB chip is around 656 ft, which is the range of successful exchange of probe packets.

Figure 15A:
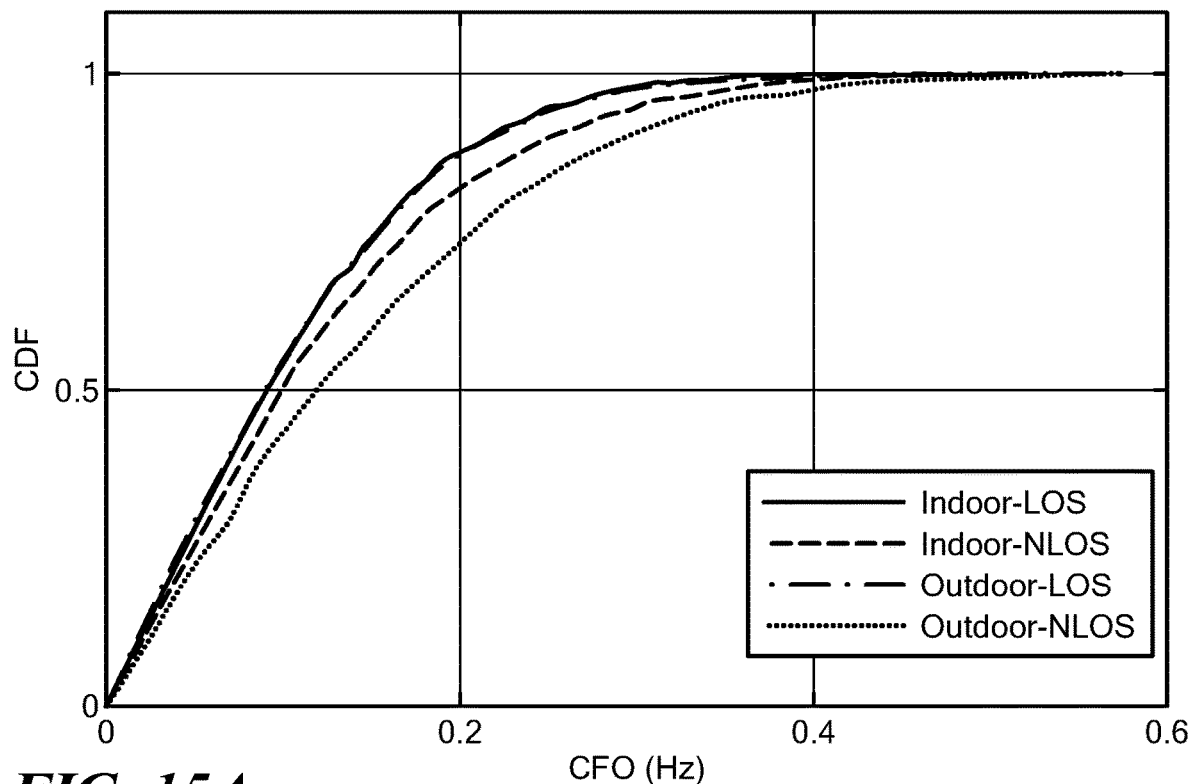
FIGS. 15A-B illustrate behavior of RF clock and GPSDO in LOS/NLOS environment with indoor and outdoor settings.
Figure 15B:
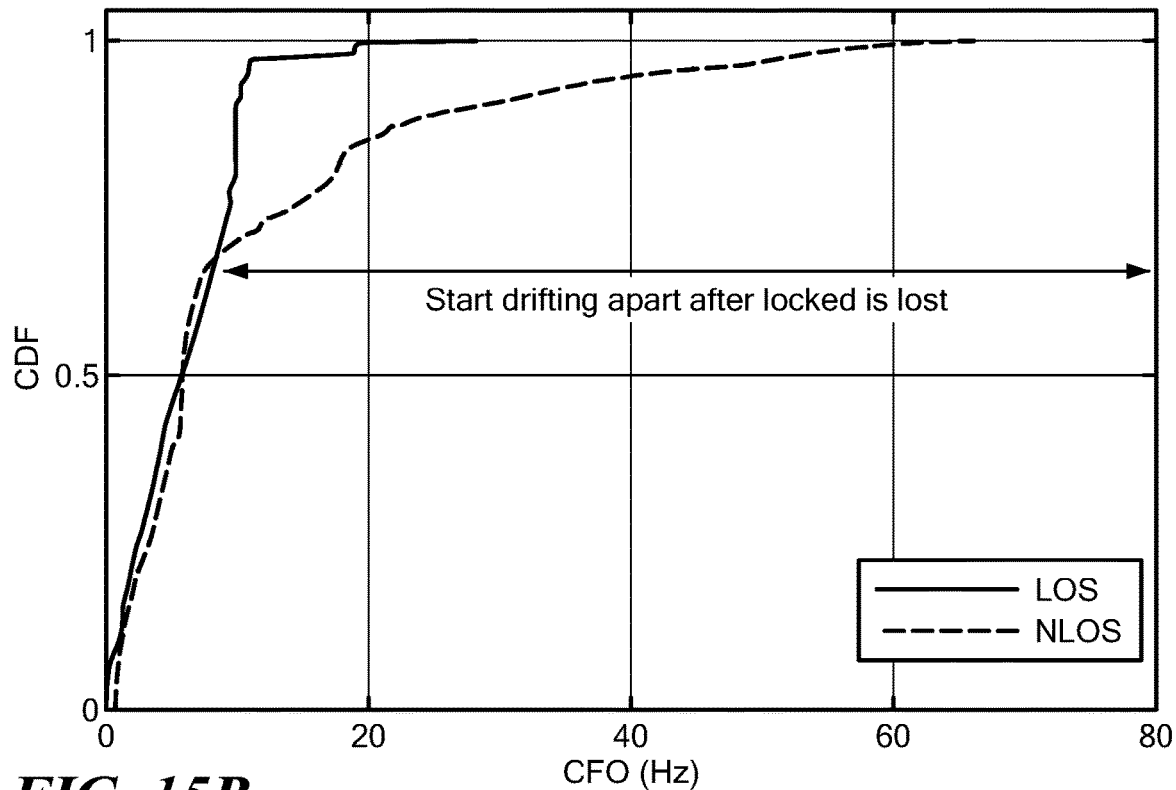

FIGS. 15A-B illustrate behavior of the RF clock and GPSDO in LOS/NLOS environment with indoor and outdoor settings. From FIG. 15A, it is seen that the RF clock is not significantly impacted by NLOS indoor, slightly degrade for outdoor, still CFO is in permissible range, whereas the GPSDO's clock starts drifting resulting in increased CFO error, as observed in FIG. 15B.

Figure 14A:
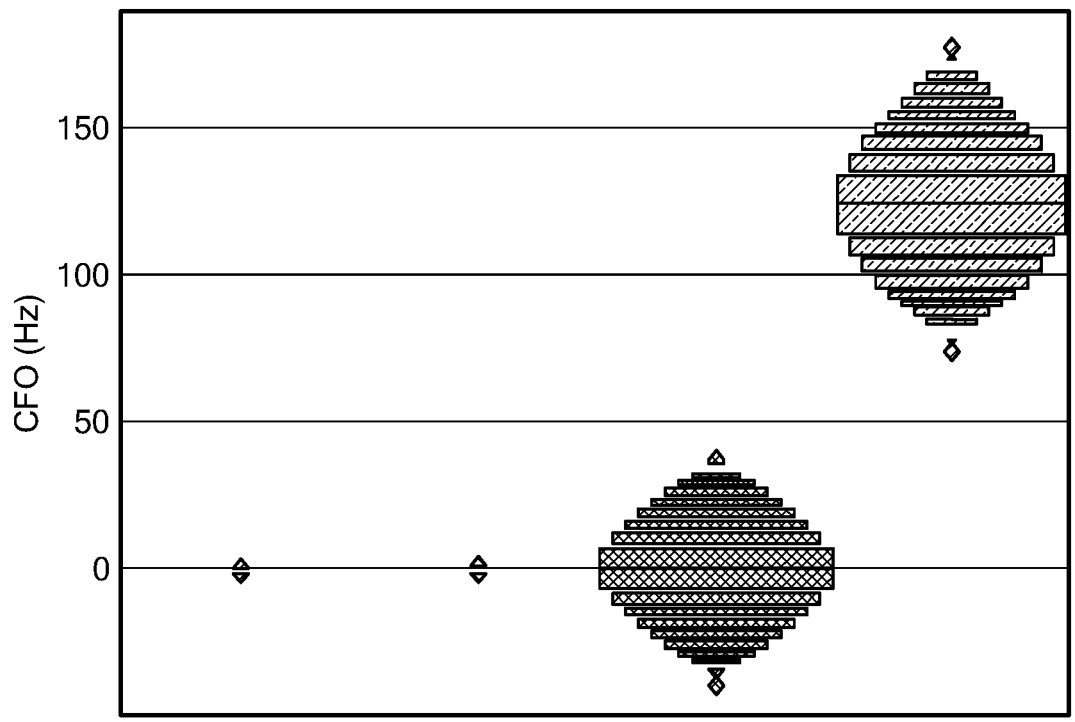
FIGS. 14A-B illustrate performance comparison of different reference clocks used with SDRs.
Figure 14B:
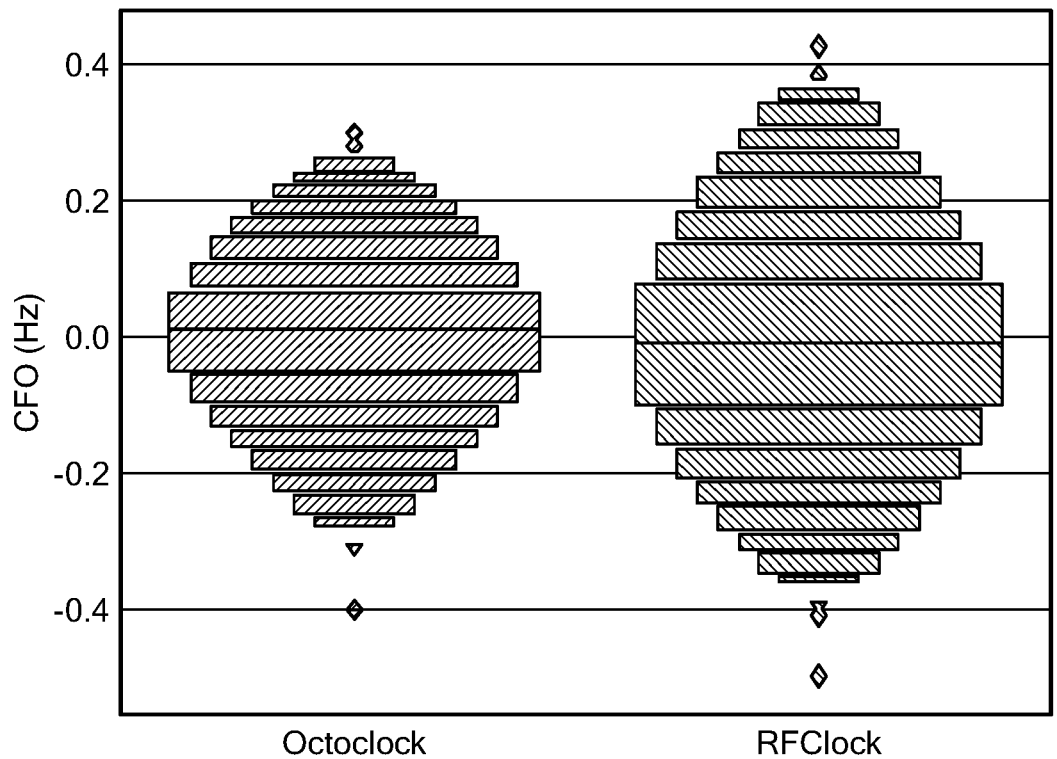

FIG. 16 illustrates the advantages of the RF clock in terms of the carrier frequency offset (CFO). Six SDRs are integrated with RF clock followers and place them at random locations in a 96 ft×124 ft indoor area with maximum leader-follower separation of 80 ft. 802.11n OFDM frames have been used to estimate CFO between these SDRs driven by the RF clock. Each such OFDM packet is of length 1024 bytes with QPSK/64QAM modulated random data as payloads and is transmitted in a 5 MHz channel bandwidth at 915 MHz and 40 MHz channel bandwidth at 2.4 GHz. The frame structure includes two training sequences, STS and LTS. STS occurs at the beginning of the OFDM packet and is used to detect the start of the packet along with coarse frequency offset estimation. After this, LTS is used for channel estimation and fine frequency offset. Thus, the overall CFO is summation of these two individual offsets. However, CFO estimation is affected by SNR level of 802.11n WiFi signals, inducing extra estimation noise as error into CFO during this estimation, which does not fully capture the real accuracy of the RF clock. The above test has been repeated with (i) the Ettus Octoclock and (ii) Ettus GPSDO average estimated CFO of over 2000 packets transmission for all set of radios. It can be first observed that CFO varies between 75-180 Hz, with a median value of 123.6 Hz at $915$MHz carrier frequency for different SDR units from the same Ettus B210 family, when an internal oscillator is used. From FIGS. 14A-B, the deviation in the CFO of these different synchronization methods can be observed. The RF clock is superior to the GPSDO as the median CFO is 0.094 Hz and 7.58 Hz, respectively. Moreover, the RF clock performance approaches the wired Octoclock, which has a median CFO of 0.059 Hz. FIG. 16 shows the CFO comparison when WiFi packets are transmitted at 2.4 GHz with 64QAM modulated data in a 40 MHz channel bandwidth.

The median CFOs are 0.263 Hz and 0.401 Hz for Octoclock and the RF clock, respectively.

Figure 18A:
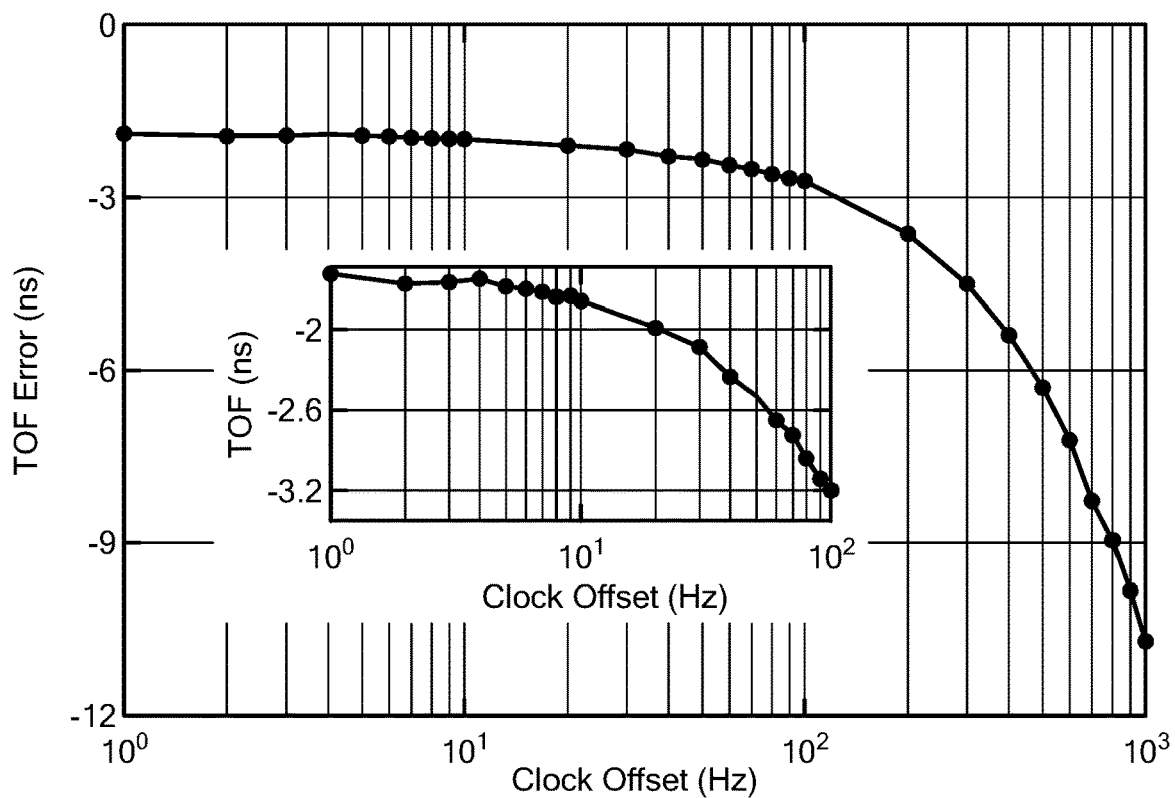
FIGS. 18A-B illustrate the relationship between time of flight and frequency offset.
Figure 18B:
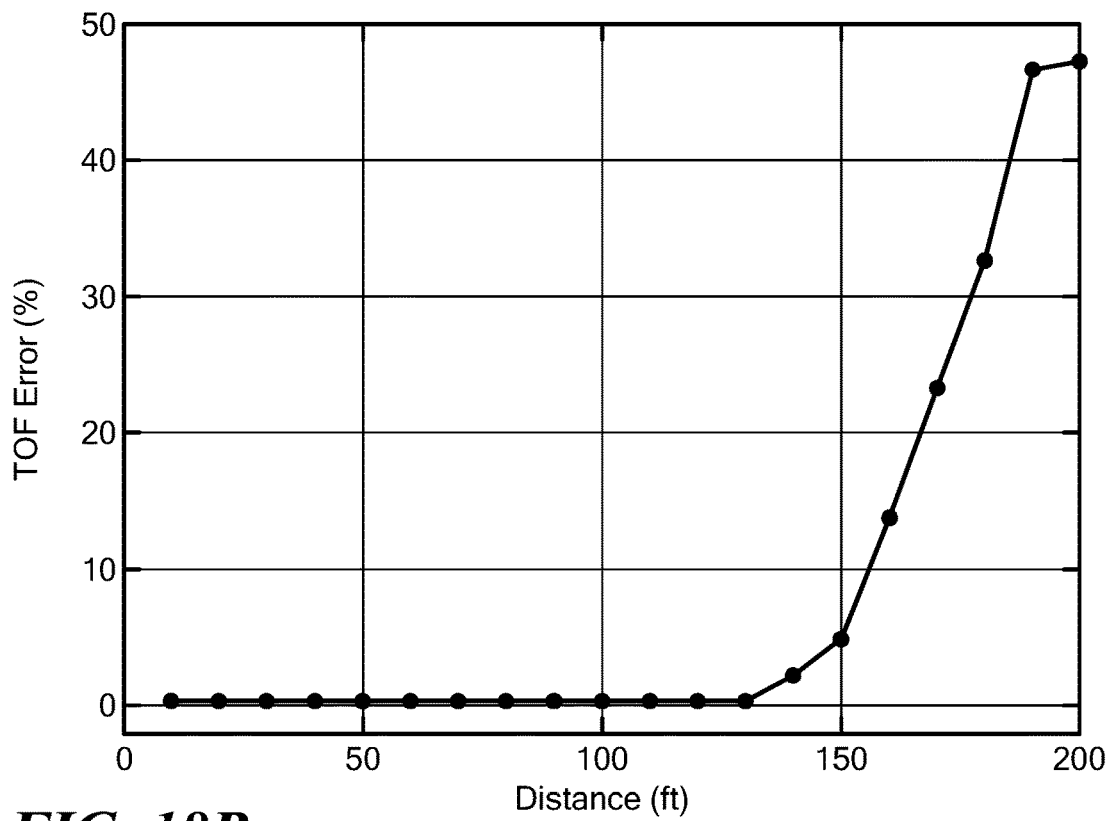

FIGS. 18A-B illustrate the relationship between time of flight and frequency offset and the effect of clock offset on ToF estimation. To eliminate clock offset between UWB radios, external synchronization of these radios is enabled by generating two 38.4 MHz clock signals from the same PLL and attaching them to our custom-designed boards, which provides access to UWB radio's clock input (in system level practice, this clock input is fed by output of the RF clock's front-end). The clock offset is controlled between these two 38.4 MHz clock signals through the PLL, and this allows us to generate a known frequency offset between two devices. The ToF is measured by UWB ranging as shown in FIG. 10. The frequency of the one radio's reference clock signal (38.4 MHz) is increased in steps of 1 Hz, up to a final value of 1 KHz. From FIG. 18A it can be observed that the ToF error escalates significantly through increase of clock offset. Consequently, this error decreases synchronization accuracy while inducing error in ranging.

Figure 19A:
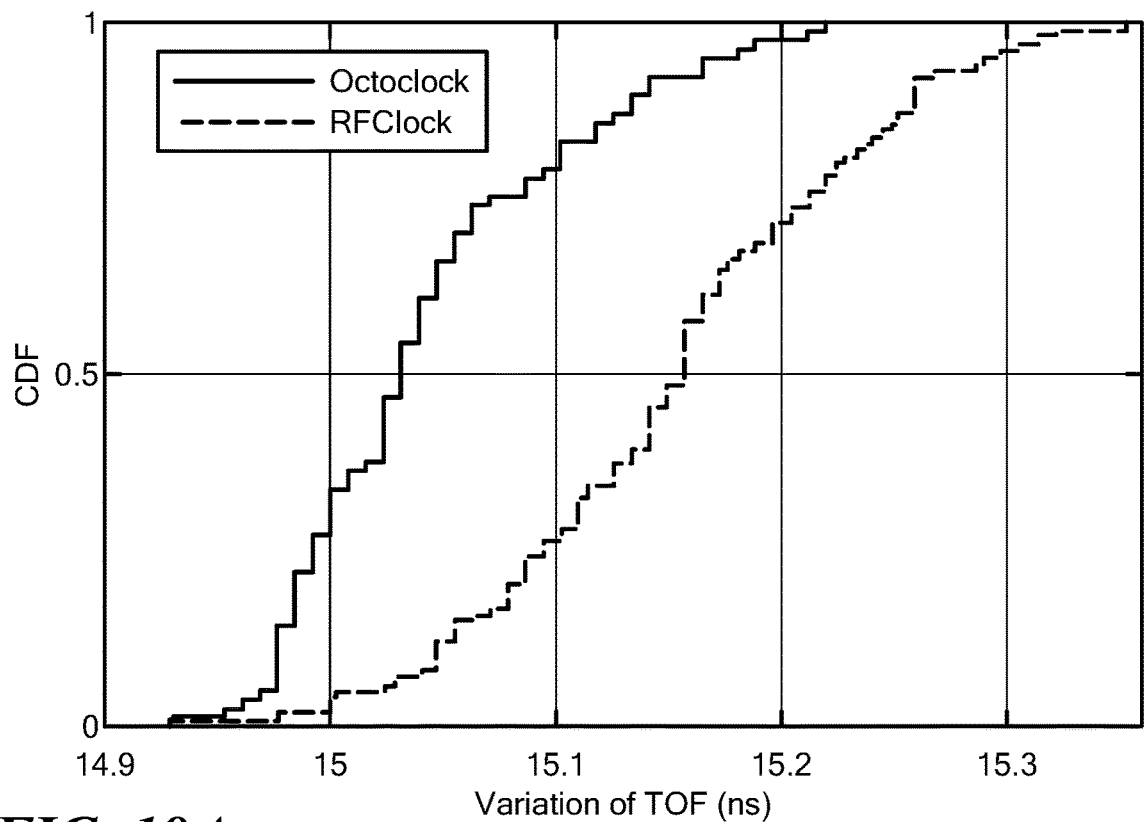
FIGS. 19A-B illustrate the performance comparison of different reference clocks used with SDRs in terms of the phase offset estimation.
Figure 19B:
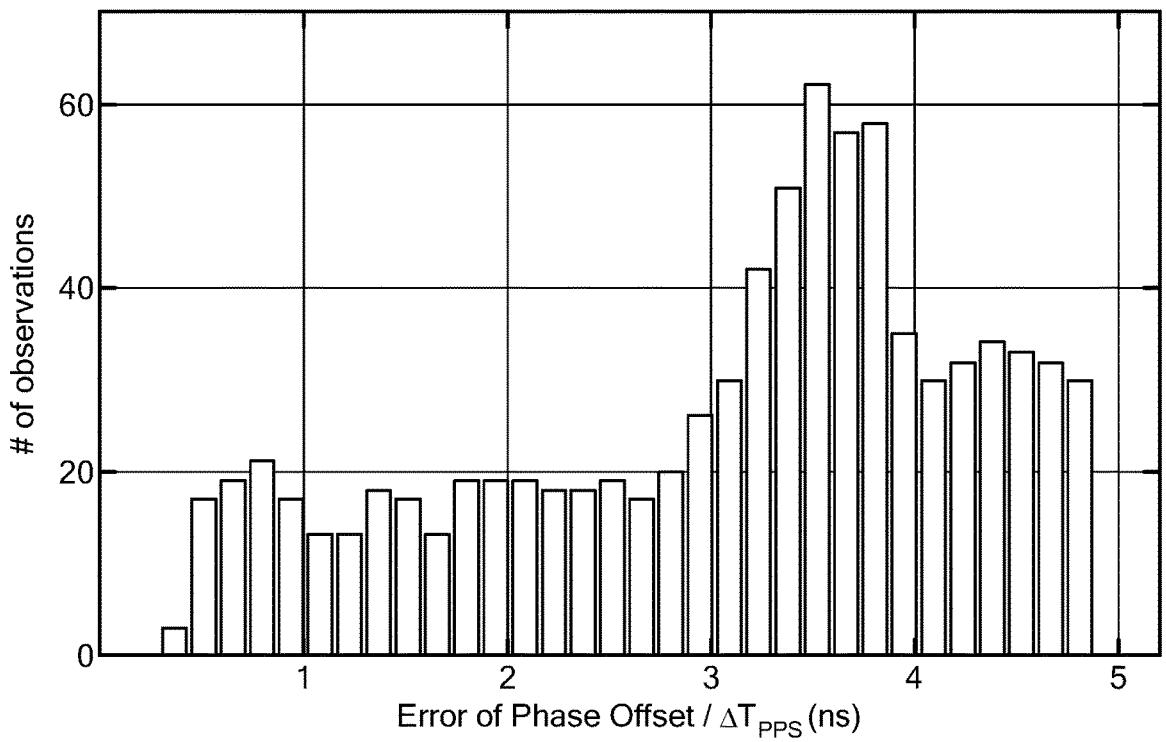

FIGS. 19A-B illustrates the advantages of the RF clock in terms of time and phase synchronization. The phase/time estimation unit of the RF clock follower and the RF clock leader are used that are mainly controlled by the UWB module and the ARM controller. All evaluations are carried out UWB radio's highest data rate of 6.8 Mbps with preamble length of 128 symbols and a pulse repetition frequency of 64 MHz. To estimate phase offset $\Delta T_{pps}$, which depends on time of arrival estimation (TOA), accurate timestamps of received messages (POLL/RESPONSE) are ensured. The key idea is to first detect the direct path of the incoming signal and there by estimate arrival time as exactly as possible. For this purpose, the leading-edge detection (LDE) algorithm embedded in the UWB radio is used to detect the direct path of the incoming signal that is extracted from channel impulse response (CIR) measurements stored in a large buffer (4096B) with roughly $1$ns sampling time. LDE is a threshold-based algorithm that detects the first direct path (FP) when the first stored CIR sample is above the dynamically adjusted threshold. The threshold is calculated based on standard deviation, $\sigma_n$, and peak value of the estimated noise. To decrease false FP detection due to error in threshold estimation, a similar approach is implemented to jump back and search forward (JBSF) that searches whether there is another leading edge that exceeds the new calculated threshold in a pre-determined window ($W_n$) after determining the FP by LDE. The new threshold level is calculated by (NTM×$\sigma_n$)xc, where NTM is noise threshold multiplier set by UWB radio and c is empirically found during our analysis. Multiple CIR measurements have been analyzed with ranging and empirically found that a threshold constant c in range [0.4,0.6] decreases false FP detection, especially in NLOS condition.

Accurately estimating the time offset requires high precision ToF estimation. The ground-truth data is collected using a wired Octoclock driving the PLL (generated 38.4 MHz from Octoclock output). The Octoclock frequency offset for 38.4 MHz clock has been validated as 0.0077 Hz. This gives pico-second level error in ranging. The variation of ToF, indicated in FIG. 19A, is 477 ps, which is nearly equal to the Octoclock's performance. Therefore, the effect of the RF clock's clock offset is negligible. Experiments have also been repeated to study the distance versus the RF clock performance in terms of ToF error, noting that the any degradation starts only after 150 ft, that is a limitation imposed by the RF clock frontend. After this point, the clock recovery starts degrading and thereby affecting ToF estimation.

To compute the timestamp, UWB radio first enables a coarse RX timestamp estimation that records the first pulse of PHR (Physical Layer Header) after the SFD (Start of Frame Delimeter) and, adjusts this value based on the RX antenna delay and the first path (FP) index in CIR estimation (ToA) that is detected by LDE as explained above. The relationship between estimating ToA of transmitted signal and error in phase offset estimation of PPS in different channel conditions is demonstrated, as shown in FIGS. 17A-D. FIGS. 17A-D provide information about multipath propagation characteristics of the UWB channel between leader and followers, which is obtained from CIR measurements. FIG. 17D showcases the scenario where first sampled amplitude that exceeds the threshold (Th) is detected as FP, which is false FP detection resulted by wrong estimation of the noise threshold. Moreover, the leader-follower error distribution of 500 observations obtained from six followers in FIG. 19B shows synchronization error is below 5 ns, when JBSF approach is enabled with estimated new dynamic threshold value (NTh).

Figure 17A:
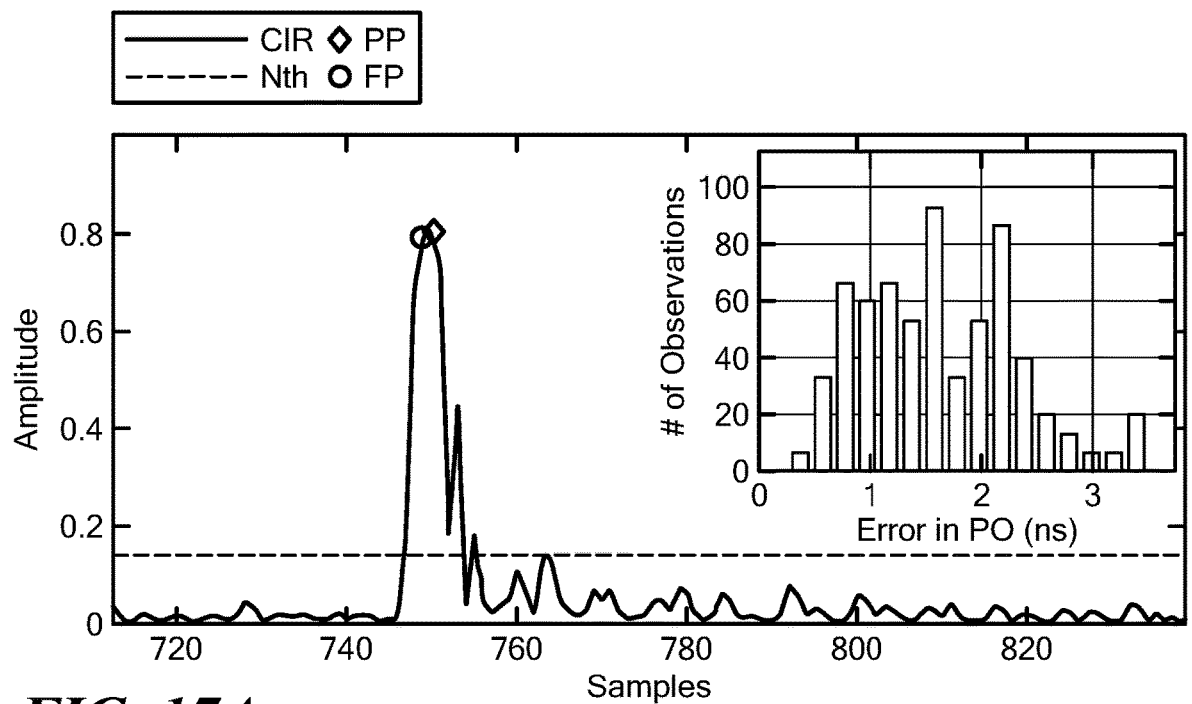
FIGS. 17A-D illustrate estimated UWB Channel Impulse Response (CIR) obtained from the RF clock followers in different channel conditions along with distribution of Phase Offset (PO) error.
Figure 17B:
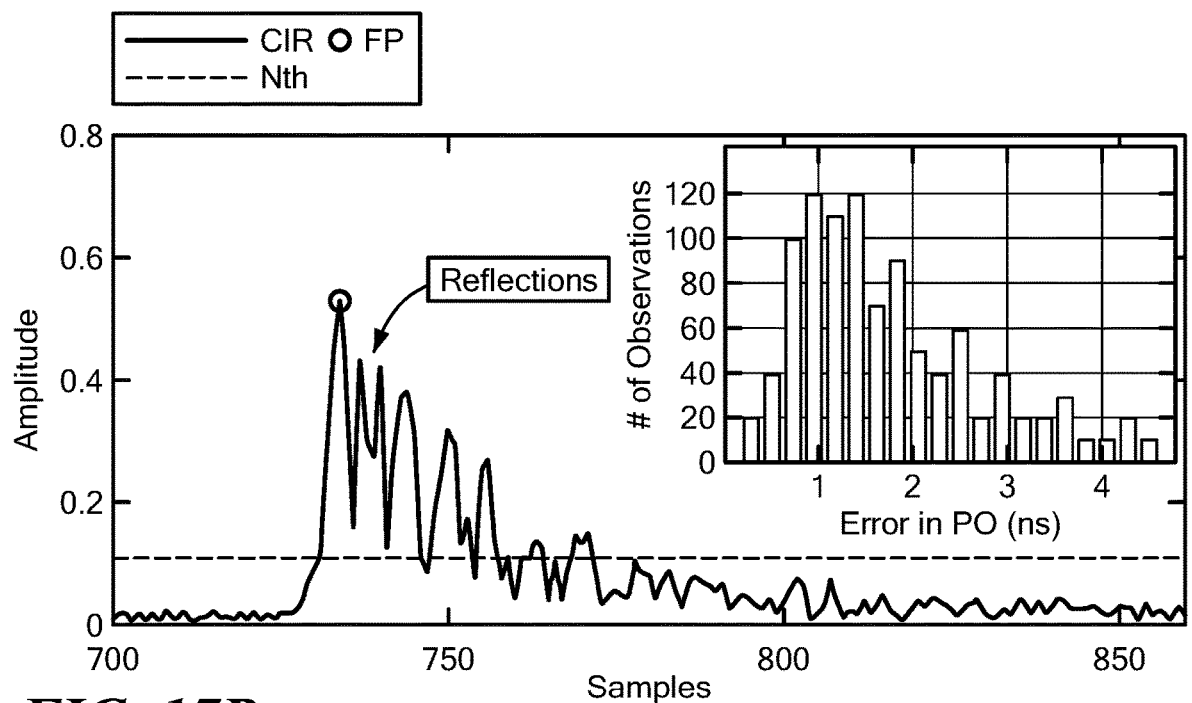
Figure 17C:
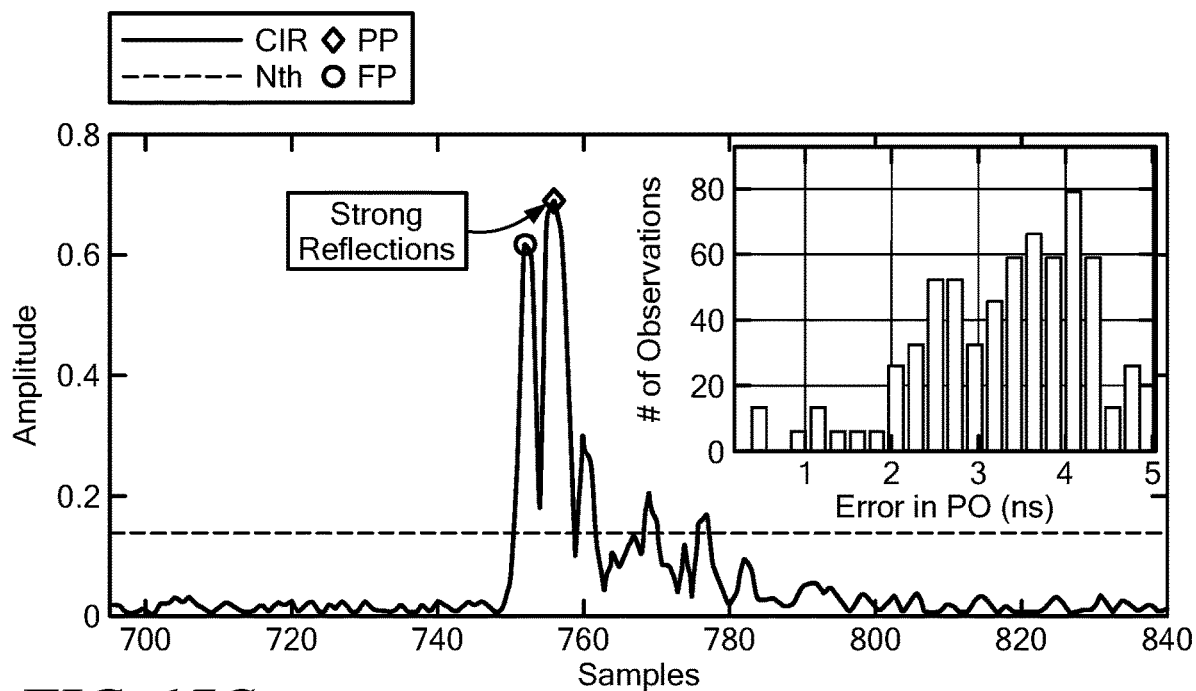
Figure 17D:
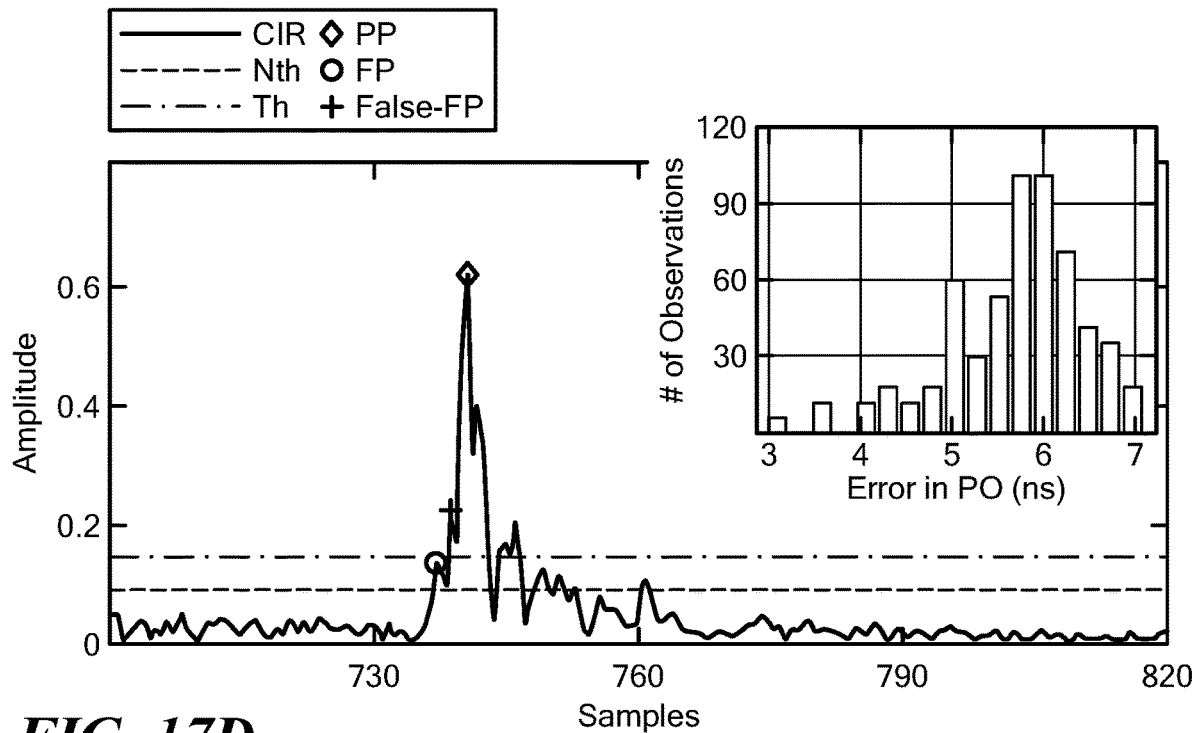

Generally, FIGS. 17A-D illustrate estimated UWB Channel Impulse Response (CIR) obtained from RFClock followers in different channel conditions along with distribution of Phase Offset (PO) error. FIG. 17A illustrates an Outdoor LOS. The peak corresponding to first direct path is clearly distinguishable. FIG. 17B illustrates an Indoor LOS (shown as the follower RX1 in FIG. 21A). The peaks of multiple reflections follow the first direct path. FIG. 17C illustrates an Indoor NLOS (shown as the follower Rx4 in FIG. 21A). The peak corresponding first direct path is not the strongest peak. FIG. 17D illustrates an Indoor NLOS (shown as the follower Rx5 in FIG. 21A). LDE is not able to detect the first direct path resulting in increased PO error.

Figure 20A:
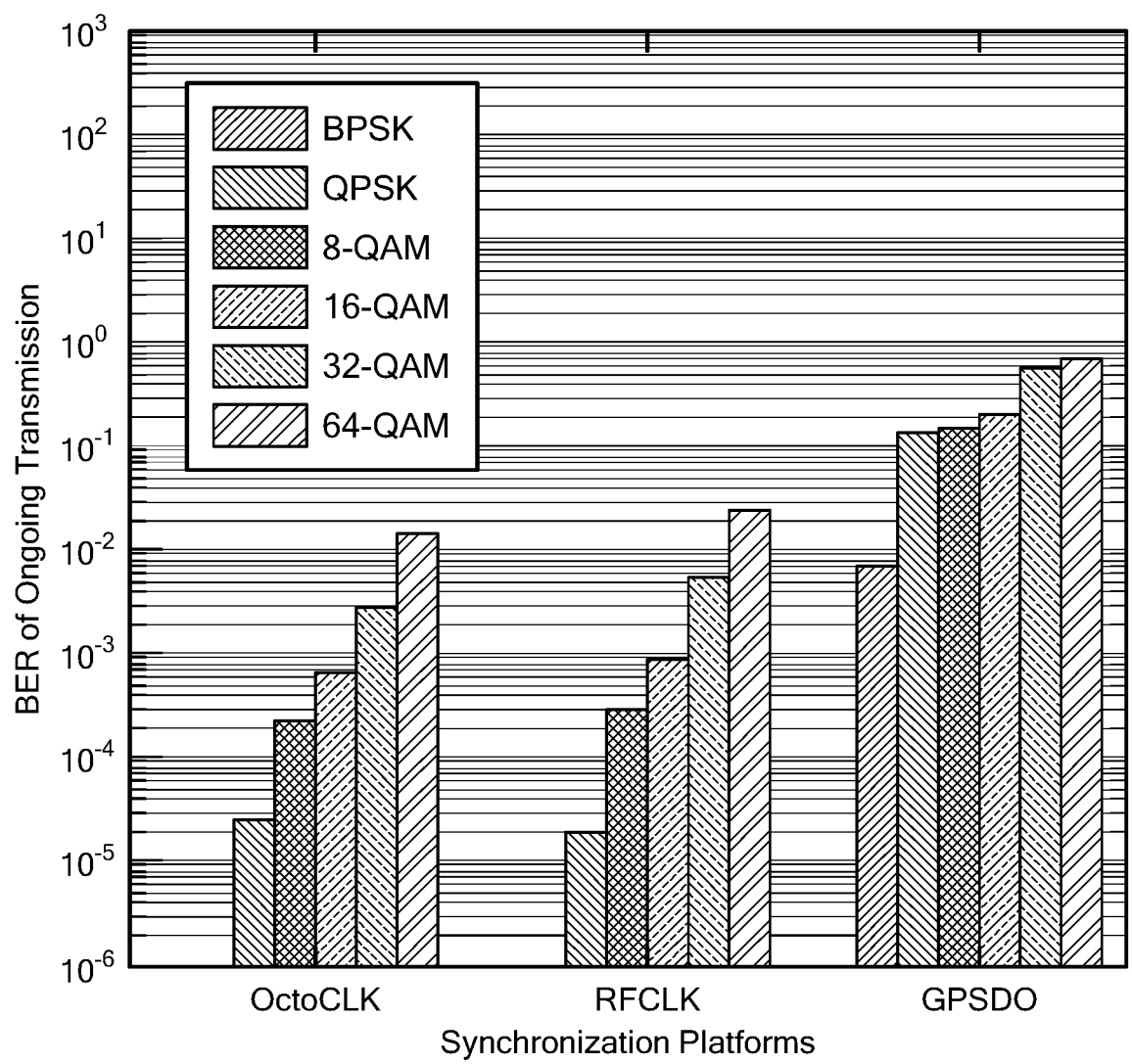

FIGS. 20A-B illustrates BER performance in different modulation schemes, with different synchronization methods, and channel gain with increasing number of transmitters. From FIG. 20A, the BER performance of the RF clock is similar to the wired setup of Octoclock for modulation schemes up to 8-QAM ($10^{-6}$ for BPSK and QPSK), but degrades slightly for 16-QAM, 32-QAM and 64-QAM.} The BER performance with GPSDO fares worse in comparison, with the BER staying near $10^{-2}$ for BPSK and rising to $10^{-1}$ \for higher modulation schemes. FIG. 20A showcases the expected effect of increasing channel gain due to DCB, as the number of transmitters is increased. This improvement in channel gain is a result of in-phase arriving signals from the transmitters, which in turn improves BER at the receiver. results demonstrate that the RF clock can enable distributed beamforming applications that require tight synchronization. Its performance is close to current wired synchronization approaches used in the industry, such as Octoclock, and performs better than the state-of-the art, GPSDO. For example, the requirements for 802.11.ax/ac to achieve MU-MIMO is 350 Hz relative clock offset between transmitters with ±0.4 μs timing constraints, while the requirement for realizing MIMO with transmitter diversity in 5G is +65 ns. Both these applications can be supported by the RF clock described herein.

Furthermore, although described herein as having commercial application in connection with 5G, the self-synchronizing SDR's and RF clocks described herein have numerous other applications, particularly where a plurality of wireless devices is in proximity to one another. For example, this technology can be used to provide more robust, jamming-resistant communications between an array of airborne devices (e.g., in a drone swarm) such that, should a portion of the airborne devices be jammed or otherwise eliminated, communication can be maintained. In addition, because f1 and f2 are adjustable within the system by the AI control, jamming can also be circumvented by adaptively changing frequencies during operation. Similarly, such airborne arrays using the self-synchronizing SDR's described herein can more effectively engage in offensive jamming against enemy targets.

Such resilient communication and jamming can also be performed in the context of stationary device arrays such as, for example, those found in commercial, industrial, and/or military buildings or installations.

Figure 21A:
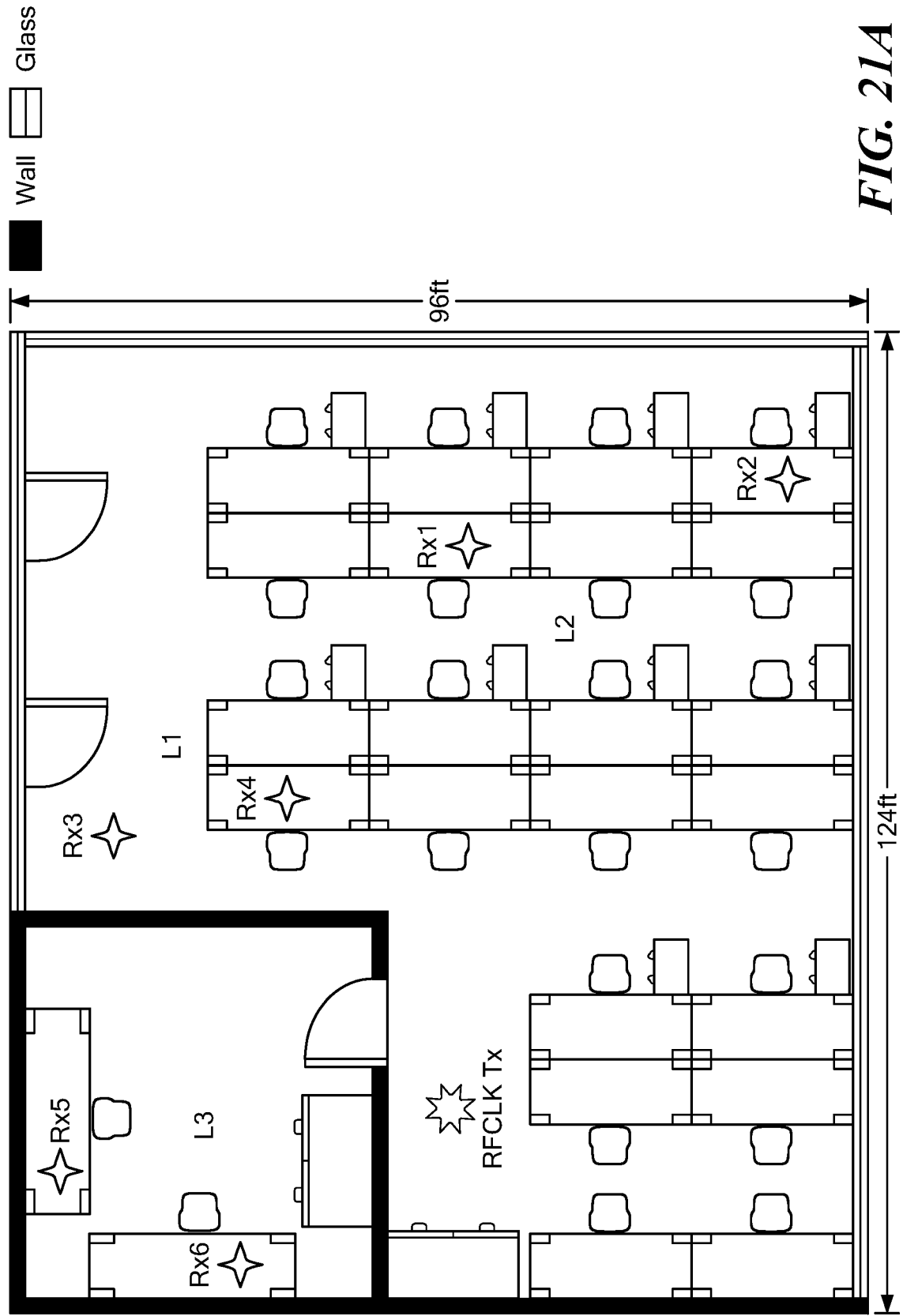
FIG. 21A illustrates a crowded office environment for experimental evaluation.

The block diagram for the implementation of RF clock leader and follower is shown in FIGS. 7A and 7B, respectively. RF clock is evaluated, both in terms of its synchronization capability with respect to wired and GPS solutions, as well as overall performance when used with COTS B210 SDRs for DCB. The RF clock experiments were performed in indoor and outdoor settings. Experiments were performed in a 96 ft×124 ft crowded office environment (e.g many desks, metallic equipment and other types of reflectors in close proximity) as shown in FIG. 21A. Experiments were also conducted outdoors, amidst low/moderate-height buildings with maximum 100 ft leader-follower separation, and also approximately 6 ft inter-follower separation when placed in a linear array.

Implementation Summary

As tested, the RF clock leader included a i) reference oscillator Ettus GPSDO (e.g 10 MHz), ii) RF frequency synthesizer ADF4350 that locks to reference oscillator to produce two-tone signal at desired frequency $f_1+f_2$, iii) RF power combiner and amplifier used to combine the two-tone signal and transmit over-the-air, iv) a DECAWAVE DW1000 UWB radio IC, and v) an ARM-Cortex microcontroller nRF52832, that orchestrates all RF clock functions.

RF clock follower includes the following design units; i) RF clock front-end, ii) clock-edge alignment, iii) PPS generation and iv) phase/time estimation (see also FIG. 2 for the fabricated design). The front-end design (see FIG. 9 for example) includes passive resistors, capacitors and diodes. An adjustable impedance matching filter composed of wiSpry WS1040 digital capacitor array allows flexible tuning of desired frequencies. A 4-stage rectifier composed of HSMS285C Schottky diodes extracts the envelope. Last, the extracted clock signal passes through a band pass filter with center frequency at 10 MHz. The envelope output drives a low jitter PLL Si5346 from Silicon Lab. One output of the PLL is connected to the PIC microcontroller PIC12F683 to produce 1PPS signal. The phase difference between 10 MHz/38.4 MHz and the local PPS is measured using the time to digital converter (TDC). The UWB Decawave DW1000 module (from Sec. 5.2.2) is responsible of estimating $\Delta T_{pps}$, which has capability of time-stamping the transmission and reception of packets with a resolution of 15.65 ps. The Cortex-M ARM microcontroller synchronizes clock edges with estimated phase offset through the delay chain composed of cascaded multiple DS1023 timing elements that allows delays up to 100 ns. Finally, power consumption of front-end design is 6.6 µW, while the energy consumed for a single UWB ranging operation is 0.1590. As seen from Table 1 UWB radio's current consumption changes over each operation state. Considering all system components such as RF clock front-end, clock edge alignment and phase/time estimation, the power consumption range changed between 170-390 mW.

TABLE 1

| Deep Sleep | Sleep | Idle | Tx | Rx |
|---|---|---|---|---|
| 50 nA | 1 µA | 14 mA | 59 mA | 75 mA |

RF Clock Coverage Range

Maximum coverage range of the system is obtained using conventional free space path loss (FSPL) between leader and follower. This was achieved by measuring follower RF sensitivity in terms of front-end design and UWB ranging performance, and determining leader's transmitted power along with other parameters. FIG. 13A shows the measured peak-to-peak voltage of follower's extracted clock signal versus input power (antenna gain not included). −22 dBm was selected as the front-end sensitivity, which is the minimum required power for the clock recovery mechanism to perform recovery and enable the rest of the system. In addition, adjustment of the leader's transmission power to the maximum permissible level based on FCC's limitation of 36 dBm per transmitter in the 900 MHz ISM band FCC. Since the leader transmits two different single tones over the air, the total transmitted power is 39 dBm. This gives the maximum allowable coverage radius as 164 ft (with additional increase possible with a multi-antenna transmitter at the leader). Similarly, the regulatory limit for UWB is 41.3 dBm/MHz if frame transmission time is less than 1 ms, which corresponds to total channel power of −14.3 dBm/500 MHz. The UWB parameters were adjusted to increase this upper bound such that by using the highest data rate of 6.8 Mbps and a preamble length of 128, the total frame transmission time can be contained to 180 µs. This reduction allows boosting transmitter power to 6.9 dB. The minimum permissible receiver sensitivity of UWB chip is −94 dBm, which can be improved by decreasing clock offset between paired radios. Since the system eliminates this offset by extracting reference clock from the leader's transmission (see also FIG. 18A), this lower bound was decreased to −106 dBm. Considering a frequency of 3993.6 MHz, the coverage distance of this UWB chip is around 656 ft, which also serves as the range for successful exchanging of probe packets.

Testing Frequency Synchronization

Method: Six SDRs were integrated with RF clock followers and placed at random locations in a 96 ft×124 ft indoor area with maximum leader-follower separation of 80 ft. 802.11n OFDM frames were used to estimate CFO between these SDRs driven by the RF clock, as explained in 3.2.1. Each such OFDM packet is of length 1024 bytes with QPSK/64QAM modulated random data as payloads, and is transmitted in a 5 MHz channel bandwidth at 915 MHz and 40 MHz channel bandwidth at 2.4 GHz. The frame structure includes two training sequences, STS and LTS. STS occurs at the beginning of the OFDM packet and is used to detect the start of the packet along with coarse frequency offset estimation. After this, LTS is used for channel estimation and fine frequency offset. Thus, the overall CFO is summation of these two individual offsets. However, CFO estimation is affected by SNR level of 802.11n WiFi signals, inducing extra estimation noise as error into CFO during this estimation, which does not fully capture the real accuracy of the RF clock. To eliminate multipath effect on CFO estimation and providing high SNR conditions, one SDR radio attached with RF clock follower was moved to the locations of other radios, to transmit and receive WiFi frames, and connect them via cables at RX and TX ports to enable ground-truth error floor of the system while RF clock leader and followers remained as in FIG. 21A, except the follower attached to transmitter SDR radio. Then, results were obtained with omni-directional antennas with the transmitter SDR attached to RF clock leader. This setup permits the extraction of estimation error with respect to ground-truth data and estimate CFO for each of the radios.

Figure 16A:
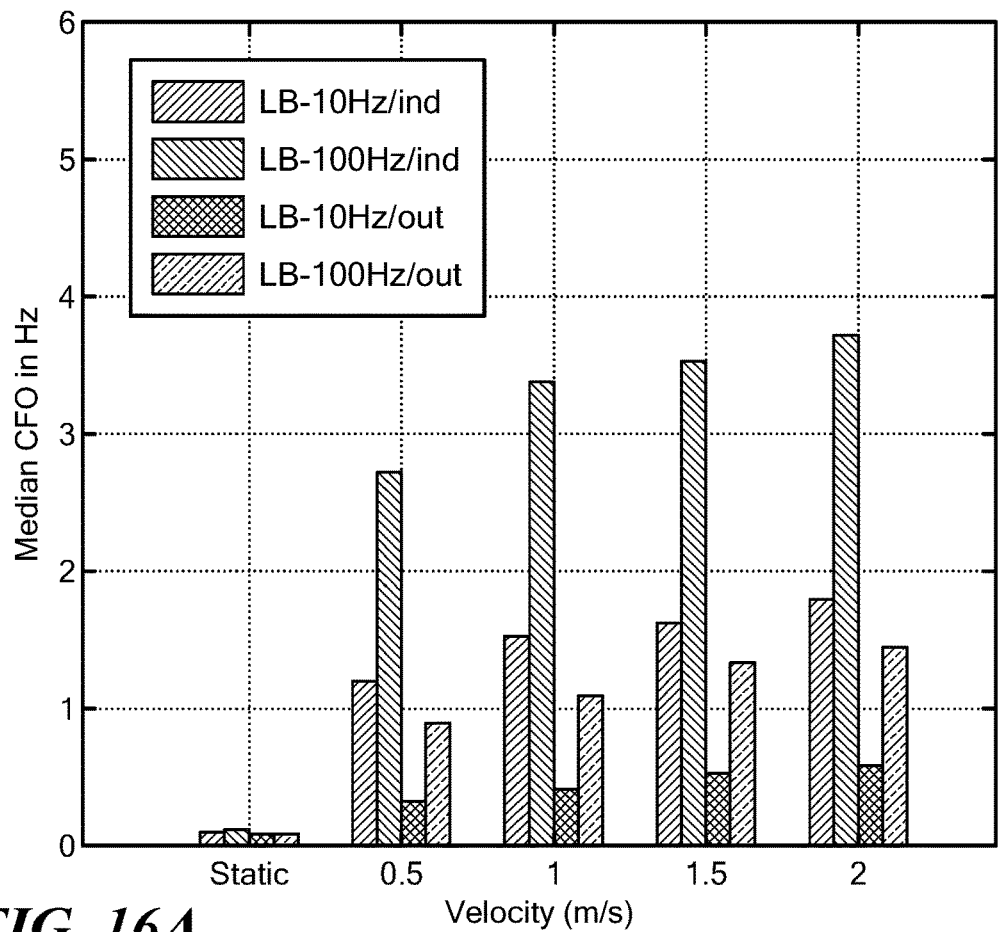
FIG. 16A illustrates the advantages of the RF clock in terms of the carrier frequency offset, showing the impact of mobility on CFO.
Figure 16B:
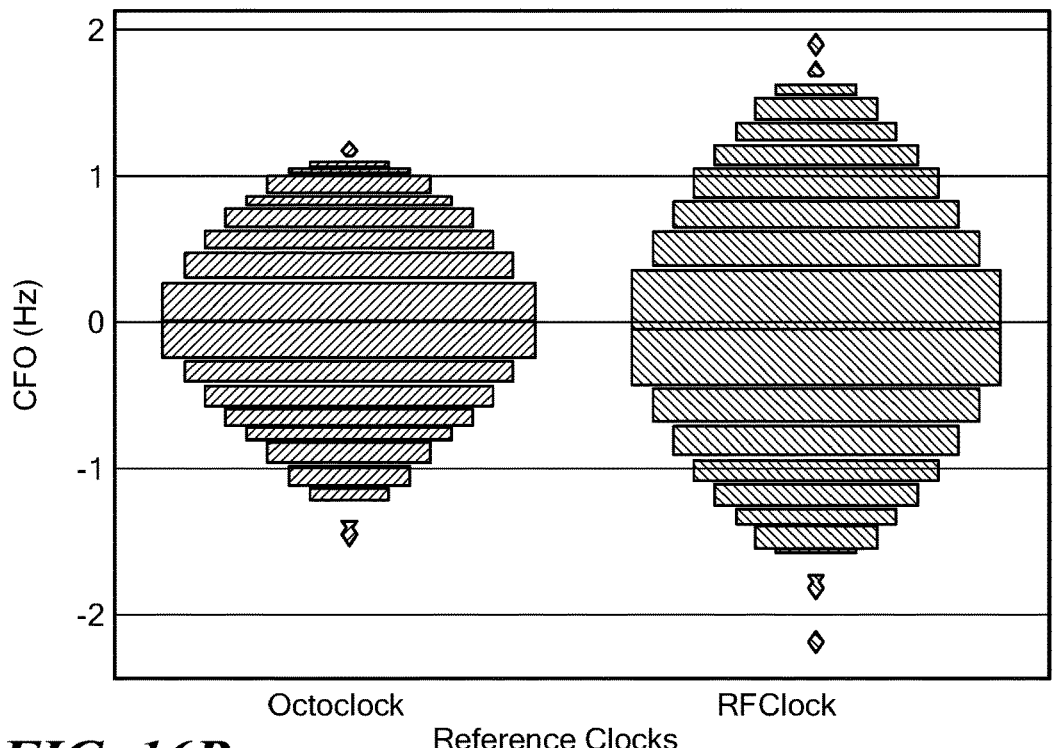
FIG. 16B illustrates the advantages of the RF clock in terms of the carrier frequency offset, showing CFO estimation at 2.4 GHz with 40 MHz channel bandwidth.

Performance Comparison: The above test was repeated with (i) the Ettus Octoclock and (ii) Ettus GPSDO and average estimated CFO of over 2000 packets transmission for all set of radios. It was first observed that CFO varies between 75-180 Hz, with a median value of 123.6 Hz at 915 MHz carrier frequency for different SDR units from the same Ettus B210 family, when an internal oscillator is used. From FIG. 14 the deviation in the CFO of these different synchronization methods can be observed. RF clock is superior to the GPSDO as the median CFO is 0.094 Hz and 7.58 Hz, respectively. Moreover, RF clock performance approaches the wired Octoclock, which has a median CFO of 0.059 Hz. FIG. 16B shows the CFO comparison when WiFi packets are transmitted at 2.4 GHz with 64QAM modulated data in a 40 MHz channel bandwidth. The median CFOs are 0.263 Hz and 0.401 Hz for Octoclock and RF clock, respectively.

Multipath and NLOS performance: Next, the impact of multipath and NLOS on synchronization of the SDRs was studied in a rich indoor multipath environment located in L1 and L3 as in FIG. 21A and outdoor settings where RF clocks coordinate with/without LOS. The same experiment is repeated outdoors with/without LOS to satellites for GPSDO-mounted SDRs. As shown in FIG. 15A, RF clock is not significantly impacted by NLOS indoors, and slightly degrades outdoors while maintaining CFO within permissible range. However, GPSDO's clock starts drifting resulting in increased CFO error, as observed in FIG. 15B.

Impact of mobility: Moderate human mobility, ranging from typical walking speed of 0.5 m/s to running speed of 2 m/s in indoor and outdoor settings was also considered. As noted above, mobility introduces jitter in the received clock signal. This effect is mitigated by optimizing the digital loop bandwidth of the PLL to increase jitter attenuation. FIG. 16A demonstrates that mobility induces CFO error up to 3.73 Hz indoors when the PLL loop bandwidth is 100 Hz. This error is reduced by decreasing loop bandwidth to 10 Hz, which reduces error down to 1.8 Hz at running speed. Also, it was observed that multipath fading impacts CFO more in indoor settings.

Phase Misalignment: How much phase drift is induced due to CFO error within a single OFDM packet was also studied. With coding rate as 1/2 and data packet length and modulation, the legacy preamble STS consumes 32 µs and LTS takes 32 µs. Hence, the total packet duration is around 2.8 ms. 95% of phase misalignment during one packet duration is 0.0037 rad. 99% beamforming gain is achieved when phase misalignment of the received signals is in the margin of 15° (or 0.261 rad). Therefore, RF clock ensures phase coherence between radios. RF clock is capable of coherent transmission in the mobility scenarios, since the maximum misalignment in a packet duration is 0.623° (or 0.011 rad).

Impact of Interference: To evaluate the performance of RF clock under interference conditions, another SDR transmitter was intentionally introduced within the coverage of the earlier setup. The average signal-to-interference-plus-noise-ratio (SINR) was measured for every leader-follower pair to demonstrate the effect of interference on estimated CFO accuracy. Low SINR levels introduce jitter at recovered clock signals that induces increased CFO error during communication, as shown in FIG. 13B. This figure also shows how CFO error caused by low SINR level drops by reducing loop filter bandwidth of the PLL and CFO accuracy. The outcome is as good as operating in an interference-free condition (see 14b) when SINR≥0. For SINR<0, phase misalignment during packet duration is 4.18° which is in permissible range.

Testing Time/Phase Synchronization

Method: The phase/time estimation unit of RF clock follower and RF clock leader that are mainly controlled by the UWB module and the ARM controller, as described in Sec. 6.1 and shown in the schematic FIG. 7B were used. All evaluations are carried out UWB radio's highest data rate of 6.8 Mbps with preamble length of 128 symbols and a pulse repetition frequency of 64 MHz.

Time of Arrival Estimation: Accurate timestamps of received messages (POLL/RESPONSE) were needed to estimate phase offset, $\Delta T_{pps}$, which depends on time of arrival estimation (TOA). There are several techniques in literature to estimate TOA in different channel conditions (LOS/NLOS) and/or real multipath environments. The key idea is to first detect the direct path of the incoming signal and thereby estimate arrival time as exactly as possible. For this purpose, the leading edge detection (LDE) algorithm embedded in the DW1000 was used to detect the direct path of the incoming signal that is extracted from channel impulse response (CIR) measurements stored in a large buffer (4096B) with roughly 1 ns sampling time. LDE is a threshold-based algorithm that detects the first direct path (FP) when the first stored CIR sample is above the dynamically adjusted threshold. The threshold is calculated based on standard deviation, $\sigma_\eta$, and peak value of the estimated noise. To decrease false FP detection due to error in threshold estimation, a similar approach was implemented to jump back and search forward (JBSF) that searches whether there is another leading edge that exceeds the new calculated threshold in a pre-determined window ($W_n$) after determining the FP by LDE. The new threshold level was calculated by ($NTM_{xo_n}$) xc, where NTM is a noise threshold multiplier set by DW1000 and c is empirically obtained. Keeping c in the range [0.4,0.6] decreases false FP detection, especially in NLOS conditions.

ToF metric vs Clock Offset: the first study investigates the effect of clock offset on ToF estimation. To eliminate clock offset between UWB radios, external synchronization of these radios was enabled by generating two 38.4 MHz clock signals from the same PLL and attaching them to the custom-designed boards, which provides access to UWB radio's clock input (in system level practice, this clock input is fed by output of the RF clock's front-end). By controlling the clock offset between these two 38.4 MHz clock signals through the PLL, it was possible to generate a known frequency offset between two devices. The ToF is measured by UWB ranging as shown in FIG. 10. Frequency of the one radio's reference clock signal (38.4 MHz) was increased in steps of 1 Hz, up to 1 KHz. From FIG. 18A it was observed that the ToF error escalates significantly through increase of clock offset. Consequently, this error decreases synchronization accuracy while inducing error in ranging.

RF clock ToF estimation: Accurately estimating the time offset requires high precision ToF estimation. Using techniques described herein, ranging experiments were conducted at different distances. The ground-truth data was collected using a wired Octoclock driving the PLL (generating 38.4 MHz from Octoclock output). For 915 MHz, the Octoclock frequency offset for 38.4 MHz clock was validated as 0.0077 Hz. This gives pico-second level error in ranging. The variation of ToF, indicated in FIG. 19A, is 477 ps, which is nearly equal to Octoclock. Therefore, the effect of RF clock's clock offset is negligible (see FIG. 18A). Experiments were also repeated to study the distance versus RF clock performance in terms of ToF error, noting that the any degradation starts only after 150 ft, that is a limitation imposed by RF clock front-end, also explained in 6.2. After this point, the clock recovery starts degrading and begins to impact ToF estimation, as shown in FIG. 18B.

Phase Offset Estimation: The pairwise synchronization performance of RF clock leader and RF clock follower was also evaluated. The aim was to estimate phase offset of PPS with respect to the leader's PPS. The phase offset $\Delta T_{pps}$, is computed using timestamps recorded through POLL and RESPONSE messages. The interrupt processing delay, while resetting the local PPS, is compensated through several rounds of ranging between nodes. The offset between 38.4 MHz and local 1PPS is measured by TDC module. DW1000 first enables a coarse RX timestamp estimation that records the first pulse of PHR (Physical Layer Header) after the SFD (Start of Frame Delimiter) and adjusts this value based on the RX antenna delay and the first path (FP) index in CIR estimation (ToA) detected by LDE. The relationship between estimating ToA of the transmitted signal and error in phase offset estimation of the PPS in different channel conditions is demonstrated in FIGS. 17A-D. Here, multipath propagation characteristics of the UWB channel between leader and followers is presented, which is obtained from CIR measurements. FIG. 17D showcases the scenario where the first sampled amplitude exceeds the threshold (Th) detected as FP. This false FP detection results from the wrong estimation of the noise threshold. Moreover, the leader-follower error distribution calculated from 500 observations from six followers (see scenario FIG. 21A) is shown in FIG. 19B. The synchronization error is below 5 ns when using the estimated new dynamic threshold value (NTh).

Using RF Clock for DCB

Four transmitter B210 SDRs were set up in a linear array located in L1 location of the scenario illustrated in 21A and one receiver B210 SDR to demonstrate DCB with single user MISO (multiple input single output) and the resulting $N^2$, increase in the received power, where N is the number of available transmit antennas. The DCB approach described herein was adapted by integrating the RF clock follower with all the SDRs for frequency, phase and start time synchronization. BPSK, QPSK, 8-QAM, 16-QAM, 32-QAM and 64-QAM modulated symbols were also combined with the receiver-generated beamweights to study the impact on higher order modulations and evaluate DCB with RF clock in moderate SNR regime (10-15 dB). Using the same setup, the RF clock synchronization module was replaced with Octoclock and GPSDO for comparison with RF clock.

Experimental Evaluation

Figure 21B:
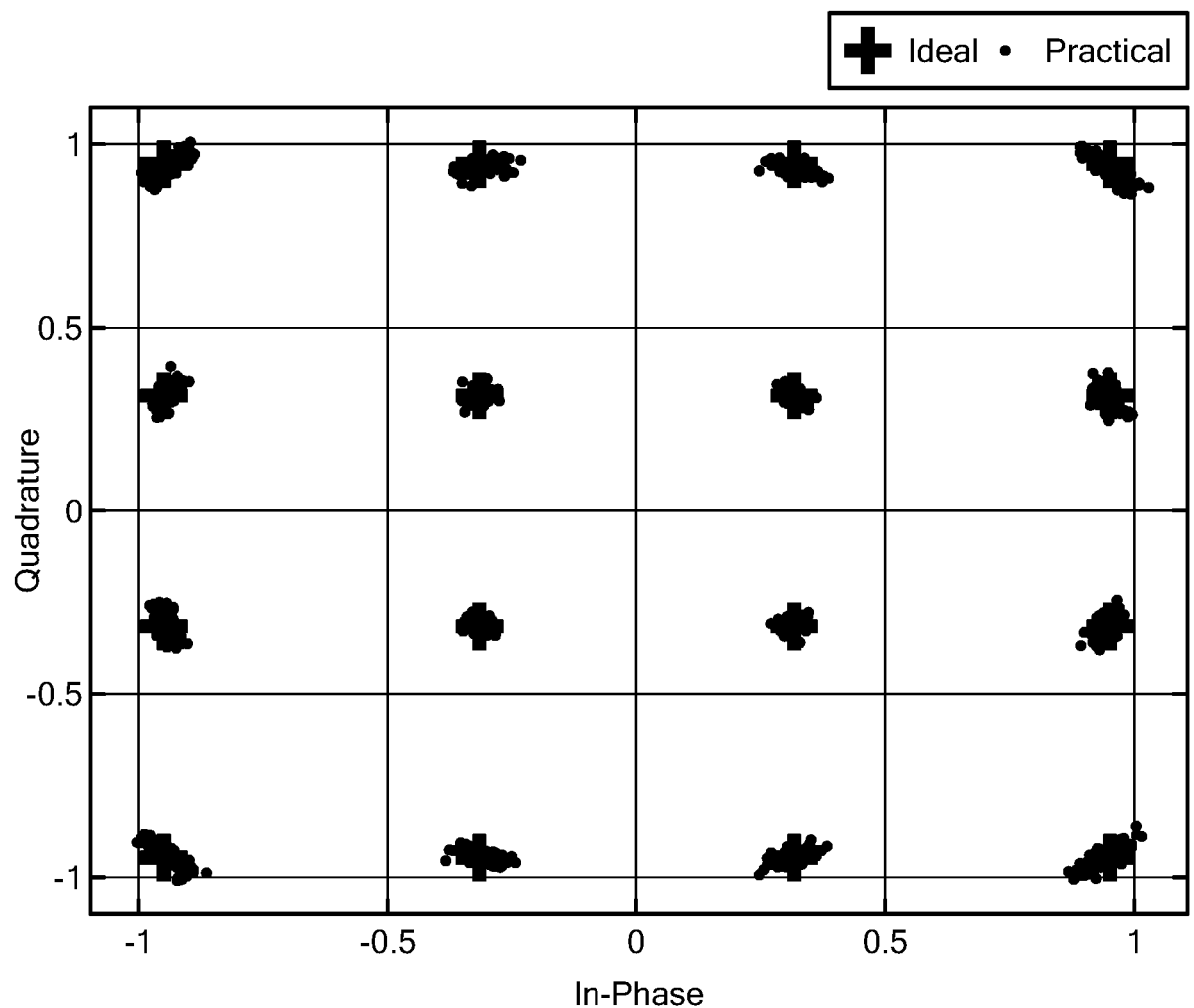
FIG. 21B illustrates a constellation diagram of 16-QAM with RFClock synchronization in DCB. The constellation points (in blue) were superimposed over 100 iterations.

The synchronization accuracy of RF clock in DCB is showcased in FIG. 21B, resulting in near-zero phase and frequency offsets on the received I/Q symbols over time throughout the duration of the experiment. The impact of RF clock on BER for different modulation schemes, when compared with Octoclock and GPSDO, is shown in FIG. 20A. As shown, the BER performance of RF clock is similar to the wired setup of Octoclock for modulation schemes up to 8-QAM (10-6 for BPSK and QPSK), but degrades slightly for 16-QAM, 32-QAM and 64-QAM. The BER performance with GPSDO fares worse in comparison, with the BER staying near 10-2 for BPSK and rising to 10-1 for higher modulation schemes. FIG. 20B showcases the expected effect of increasing channel gain due to DCB, as the number of transmitters is increased. This improvement in channel gain is a result of in-phase arriving signals from the transmitters, which in turn improves BER at the receiver. the results demonstrate that RF clock's performance is close to current wired synchronization approaches used in the industry, such as Octoclock, and performs better than the state-of-the art, GPSDO. For example, the requirements for 802.11.ax/ac to achieve MU-MIMO is 350 Hz relative clock offset between transmitters with ±0.4 µs timing constraints, while the requirement for realizing MIMO with transmitter diversity in 5G is ±65 ns. Both these applications can be supported by RF clock.

Advantages Over Existing Solutions:

A summary of related work is provided in Table 2. Only authorreported values are included for comparison.

TABLE 2

| Prior Work | Sync Type | HW/SW | Synchronization Accuracy | Modify APP/MAC | Application |
|---|---|---|---|---|---|
| RBS | Time | SW | µs level | Yes | — |
| TPSN | Time | SW | µs level | Yes | — |
| SourceSync | Time, Frequency, Phase | SW | 5-20 ns when 25 dB > SNR > 5 dB | Yes | Opportunistic Routing |
| AirSync | Time, Frequency, Phase | SW | Phase mis-alignment <0.078 rad time: within CP of OFDM (0.8-3.2 µs) | Yes | Dist. MU-MIMO |
| MegaMIMO | Frequency, Phase | SW | Phase mis-alignment <0.05 rad | Yes | Dist. MU-MIMO |
| AirShare | Frequency, Phase | HW | Median: 0.11 Hz/<0.005 rad @ 900 MHz and 0.4 MHz/<0.016 rad @ 2.4 GHz | No | Dist. MIMO, Dist. rate adaptation |
| PULSAR | Time | HW | <5 ns | No | — |
| Vidyut | Time, Frequency, Phase | HW | Mean: 225 ns Phase mis-alignment <0.0218 rad | No | OFDMA, MIMO |

TABLE 2-continued

| Disclosed Herein | Sync Type | HW/SW | Synchronization Accuracy | Modify APP/MAC | Application |
|---|---|---|---|---|---|
| RF Clock | Time, Frequency, Phase | HW | Median: 0.097 Hz @ 915 MHz <5 ns | No | Dist. SU-MISO |

Wired and COTS Alternatives: A wired connection between the reference source, like the Ettus Octoclock, and deployed devices is the most straightforward way to eliminate frequency and phase offsets. However, because the length of the cable determines the phase of the received clock signal, cable inputs to each device should have matched conductive properties and lengths. Although distributed transmitters should not be constrained by fixed wirelengths, we use the Octoclock as the baseline for comparison with Rf clock in Sec. 6 and Sec. 7.1. Highly stable oscillators such as GPS-disciplined oscillators (GPSDO), oven-controlled oscillators (OCXO) and chip scale atomic clock (CSAC) can potentially minimize frequency offsets. However, these are expensive solutions with high power consumption of around 1 W. In addition, GPSDO requires line-of-sight to satellites, which makes it applicable only for outdoors. On the contrary, RF clock bill of materials is low cost, with 70% lower power consumption than the GPSDO. Moreover, Rf clock is resilient to multipath and can operate in both NLOS outdoor and indoor scenarios. The WWVB atomic clock broadcast from National Institute of Standards and Technology (NIST) can synchronize receivers in the order of seconds, but this is too coarse for many PHY-layer operations like DCB. NIST also has an optical method that can synchronize clocks to within one femtosecond across a 4 km free space link, but this requires LOS.

Synchronization through Message Exchange: Classical approaches developed for wireline solutions like Network Time Protocol (NTP) can achieve millisecond level of accuracy. Precision Time Protocol (PTP) is similar to NTP but reaches submicrosecond level performance. It uses hardware-generated timestamps to estimate propagation time of signals and can achieve time synchronization in a wired network accurate to 25 ns. White Rabbit gives sub-nanosecond accuracy over optical fibers by integrating packet-based synchronization used by the PTP with Synchronous Ethernet. Reference Broadcast Synchronization (RBS) uses inter-node timestamp exchange to compensate for transmission delays to achieve sub-µs accuracy while The timing sync protocol for sensor networks (TPSN) achieves microsecond level accuracy. However, both RBS and TPSN assume that time of flight is negligible and do not account for clock drift. As clock skew increases over time, they require frequent re-synchronization which increases energy consumption and bandwidth usage. Flooding-Time Synchronization Protocol (FTSP), Glossy, and PulseSync address the problem of time synchronization by constructive interference through controlled flooding. However, PulseSync and Glossy are topology dependent and do not consider channel effects of interference and possible packet losses.

Protocol-dependent Synchronization: SourceSync harnesses sender diversity through a specially constructed synchronization header. While this approach can achieve better than 20 ns accuracy, it imposes constraints on the application or underlying MAC protocol. For synchronization, SourceSync includes header fields before the payload, which comprises of the 802.11 legacy preamble (80 µs), followed by a channel estimation field (25.6 µs), flag ID (25.6 µs), SIFS (10 µs) and ends the header portion with the co-sender FIG. 3: RF carrier generation channel estimation field (25.6 µs), resulting in 166.8 us of total overhead. Now, to achieve synchronization accuracy of less than 20 ns, SourceSync replaces the data in each packet with 200 repetitions of the initial header, which results in a total incurred overhead induced delay of 33.36 ms before the payload can be transmitted. While this method can be used to evaluate the extent of synchronization error, the ensuing overhead limits its use in real-world scenarios. Also, before transmitting, the transmitters have additional wait time, calculated from the propagation delay from the lead transmitter to the receiver. This wait time is compounded when the senders change their original location during the transmission, such as in the case of mobile nodes. Finally, SourceSync relies on opportunistic channel access of the standard 802.11 protocol, and this may introduce additional delays in high density scenarios. Different from SourceSync's software-based synchronization approach, Rf clock's hardware-based synchronization makes it protocol-independent. Notable works like AirSync and MegaMIMO require similar modifications. AirSync enables distributed MU-MIMO using the cyclic prefix of OFDM symbol. It achieves time, phase synchronization and carrier phase coherence with a synchronization accuracy of 2.35 degrees and the 95th percentile of the synchronization error is at most 4.5 degrees (0.078 rad). MegaMIMO reduces the 95th percentile phase misalignment to 2.86 degrees (0.05 rad).

Specialized Synchronization Hardware: AirShare enables multiple nodes to share a reference clock by minimizing CFO across devices as a hardware solution. However, it delegates the task of time synchronization to SourceSync, which requires a specialized MAC protocol as discussed above. AirShare utilizes multiple nonlinear components, such as LNA, power splitter and mixer to extract the reference clock, which increase the system noise figure and harmonic distortion. Each non-linear component contributes second order harmonics of the extracted reference signal (i.e. $2(f1-f2)$, $3(f1-f2)$), inducing jitter within the clock signal and increasing the clock offset. We implemented AirShare architecture with the off-the-shelf components reported in and observed less than −29 dBc in second-order harmonics in comparison less than −37 dBc with Rf clock, resulting in larger even harmonics when converting 10 MHz reference signal to square wave clock signal. Moreover, AirShare requires higher power (in the range of mW) due to the LNA in its receiver design. On the other hand, Rf clock front-end consumes only 6.6 µW power, as it has an input impedance matching network followed by a passive envelope detector to reduce complexity and power consumption. Rf clock provides 150 ft coverage range in the easily accessible 900 MHz band (experimentally validated), almost equal to what AirShare achieves (reported theoretical distance is 210 ft at 170-180 MHz), without utilizing any active amplification in the front-end chain, and slightly better CFO accuracy (see Table 2). PULSAR is a wireless hardware platform that achieves an accuracy of 5 ns for GPS denied devices. It requires a tree-like time Rf clock is resilient to multipath and can operate in both NLOS outdoor and indoor scenarios. The WWVB atomic clock broadcast from National Institute of Standards and Technology (NIST) can synchronize receivers in the order of seconds, but this is too coarse for many PHY-layer operations like DCB. NIST also has an optical method that can synchronize clocks to within one femtosecond across a 4 km free space link, but this requires LOS.

Synchronization through Message Exchange: Classical approaches developed for wireline solutions like Network Time Protocol (NTP) can achieve millisecond level of accuracy. Precision Time Protocol (PTP) is similar to NTP but reaches submicrosecond level performance. It uses hardware-generated timestamps to estimate propagation time of signals and can achieve time synchronization in a wired network accurate to 25 ns. White Rabbit gives sub-nanosecond accuracy over optical fibers by integrating packet-based synchronization used by the PTP with Synchronous Ethernet. Reference Broadcast Synchronization (RBS) uses inter-node timestamp exchange to compensate for transmission delays to achieve sub-µs accuracy while The timing sync protocol for sensor networks (TPSN) achieves microsecond level accuracy. However, both RBS and TPSN assume that time of flight is negligible and do not account for clock drift. As clock skew increases over time, they require frequent re-synchronization which increases energy consumption and bandwidth usage. Flooding-Time Synchronization Protocol (FTSP), Glossy, and PulseSync address the problem of time synchronization by constructive interference through controlled flooding. However, PulseSync and Glossy are topology dependent and do not consider channel effects of interference and possible packet losses.

Protocol-dependent Synchronization: SourceSync harnesses sender diversity through a specially constructed synchronization header. While this approach can achieve better than 20 ns accuracy, it imposes constraints on the application or underlying MAC protocol. For synchronization, SourceSync includes header fields before the payload, which comprises of the 802.11 legacy preamble (80 µs), followed by a channel estimation field (25.6 µs), flag ID (25.6 µs), SIFS (10 µs) and ends the header portion with the co-sender FIG. 3: RF carrier generation channel estimation field (25.6 µs), resulting in 166.8 us of total overhead. Now, to achieve synchronization accuracy of less than 20 ns, SourceSync replaces the data in each packet with 200 repetitions of the initial header, which results in a total incurred overhead induced delay of 33.36 ms before the payload can be transmitted. While this method can be used to evaluate the extent of synchronization error, the ensuing overhead limits its use in real-world scenarios. Also, before transmitting, the transmitters have additional wait time, calculated from the propagation delay from the lead transmitter to the receiver. This wait time is compounded when the senders change their original location during the transmission, such as in the case of mobile nodes. Finally, SourceSync relies on opportunistic channel access of the standard 802.11 protocol, and this may introduce additional delays in high density scenarios. Different from SourceSync's software-based synchronization approach, Rf clock's hardware-based synchronization makes it protocol-independent. Notable works like AirSync and MegaMIMO require similar modifications. AirSync enables distributed MU-MIMO using the cyclic prefix of OFDM symbol. It achieves time, phase synchronization and carrier phase coherence with a synchronization accuracy of 2.35 degrees and the 95th percentile of the synchronization error is at most 4.5 degrees (0.078 rad). MegaMIMO reduces the 95th percentile phase misalignment to 2.86 degrees (0.05 rad).

Specialized Synchronization Hardware: AirShare enables multiple nodes to share a reference clock by minimizing CFO across devices as a hardware solution. However, it delegates the task of time synchronization to SourceSync, which requires a specialized MAC protocol as discussed above. AirShare utilizes multiple nonlinear components, such as LNA, power splitter and mixer to extract the reference clock, which increase the system noise figure and harmonic distortion. Each non-linear component contributes second order harmonics of the extracted reference signal (i.e. 2(f1−f2), 3(f1−f2)), inducing jitter within the clock signal and increasing the clock offset. We implemented AirShare architecture with the off-the-shelf components reported in and observed less than −29 dBc in second-order harmonics in comparison less than −37 dBc with Rf clock, resulting in larger even harmonics when converting 10 MHz reference signal to square wave clock signal. Moreover, AirShare requires higher power (in the range of mW) due to the LNA in its receiver design. On the other hand, Rf clock front-end consumes only 6.6 µW power, as it has an input impedance matching network followed by a passive envelope detector to reduce complexity and power consumption. Rf clock provides 150 ft coverage range in the easily accessible 900 MHz band (experimentally validated), almost equal to what AirShare achieves (reported theoretical distance is 210 ft at 170-180 MHz), without utilizing any active amplification in the front-end chain, and slightly better CFO accuracy (see Table 2). PULSAR is a wireless hardware platform that achieves an accuracy of 5 ns for GPS denied devices. It requires a tree-like time distribution network where clock synchronization errors accumulate per hop. It also relies on expensive atomic clocks, each of which costs over $5K. In contrast, Rf clock uses off-the-shelf components and errors do not accumulate as receivers extract the clock from a reference signal continuously.

Infrastructure-dependent Synchronization: Vidyut exploits the power line infrastructure to achieve time synchronization within 450 ns with a mean of approximately 225 ns. Finally, a hybrid synchronization method that leverages WLAN infrastructure to reach sub-microsecond level network synchronization—this proposed peer-level synchronization between access-points assumes that the message transmission delay is negligible for 1 hop.

Aspects, Features, and Advantages of the Technology Include:

The self-synchronizing SDR contains two hardware interfaces to connect MIMO antennas for sub-6 GHz and synchronization antenna by using a 50-ohm SMA connector with low attention A customized MIMO SDR is a small form factor and extremely light (e.g., 8 gram) software-defined radio which has an integrated wideband RF transceiver and runs Linux operating system. RF transceiver IC on MIMO SDR supports independent transmission and reception of RF signal at different frequencies between 70 MHz to 6 GHz. Additionally, the RF transceiver integrated circuit contains internal 12-bit analog-digital-converter and digital-analog-converter that provide configurable A/D and D/A sample rates up to 61.44 Msamples/sec. FPGA-based integrated Linux computer on customized MIMO SDR allows the self-synchronizing SDR to execute necessary signal/protocol processing without a host computer including GNURadio blocks and software controller modules. The proposed SDR provides two SMA jack connectors for the Rx interface and two SMA jack connectors for the Tx interface. The external reference clock can be utilized by using an external clock input pin.

The customized MIMO SDR interfaces with AI and Controller module through UART and SPI connection to transmit/receive information sent to the central coordinator and QSPI flash memory.

The present technology is an RF-based over-the-air synchronization system for COTS SDR devices that enables time, frequency, and phase synchronization of these radios' application-specific operations with respect to each other.

This sync system includes a leader who emits the combination of two-toned signal for its followers to extract intended clock frequency and orchestrates the timing synchronization by exchanging pair-wise messaging, multiple programmable followers who obey the leader's rules and extract the envelope of the received two-tone signal with additional processing steps as reference clock and applies time alignment according to message-exchange process, and multiple programmable radios, acting as either transmitter or receiver based on the implemented application, that are interfaced with RF clock leader and followers to enable synchronization among them.

This technology includes modules such as low-power front-end design to ensure frequency synchronization with low-power and passive components, interference-mitigating clock distribution to enable dynamically selection of two-tone signal to avoid the spectrum prone to interference, and highly accurate time/phase estimation to correct individual time offset of each follower with respect to the leader with clock alignment algorithm and time correction mechanism.

The sync system described in the present technology provides distributed timing and clock synchronization for large scale radios while eliminating the need of wired synchronization, which is a bottleneck for the applications, and make the devices operating in limited ranges, and decoupling the synchronization operation from the underlying MAC/APP protocol, which makes RF clock not the dependent and standalone platform that is highly programmable with multiple interfaces.

The application of this technology can include (not limited) integrating with intelligent reflector arrays to create smart surfaces, distributed coordinated beamforming, aerial communication, Internet of Things (IoT), and interfacing with COTS radios to enable these applications.

A customized MIMO SDR which is small form factor, stand-alone, and extremely light (e.g., 8 gram) software-defined radio which has an integrated wideband RF transceiver and runs the operating system.

Synchronization unit decouples the problem of the synchronization from underlying physical/link layer protocols that are usually dealt with according to application requirements and solves the tight synchronization problem with a physical layer approach that can be applied to any application scenario.

It is a state-of-the-art that achieves both tight frequency and time synchronization which is less than 0.107 Hz and 5 nanoseconds, respectively.

It is a cost-effective and low-power solution compared to the prior art.

It is a wireless solution whose performance is on par with the current wired synchronization approaches used by the community, such as Octoclock, and performs better than some of the other state of the art in wireless sync approaches (GPSDO).

It is not dependent on underlying protocols/apps which gives freedom to designer/operator to integrate/develop their distributed wireless methods without worrying about synchronization issues.

Synchronization of distributed systems such as distributed multi-user multiple-input-multiple-output (MU-MIMO) and distributed coordinated beamforming that enables a number of radios to synchronize phase offsets and start times exactly to beamform towards a target receiver.

Synchronization of intelligent reflector array that has large numbers of low-cost antennas to create smart surfaces.

It can be integrated into any commercial communication system to mitigate synchronization issues while developing new applications.

It is applicable to next-generation of software-defined radios and intelligent module for unmanned aerial vehicles/drones for communication and surveillance.

Total power consumption on SDR unit can be less than 1.5 watts.

The over-the-air time synchronization between a group of distributed SDR can be less than 5 nanoseconds.

The clock frequency synchronization with an offset of less than 0.107 Hz.

Design and implementation of RF clock that achieves tight frequency, phase and time synchronization required for distributed wireless applications. Power consumption is in the range of 170-390 mW, 70% lower than some state-of-the art solutions like GPSDO, and low cost.

Implementation of a complete RFClock leader-follower design and comparison of performance with the COTS wired Ettus Octoclock and GPS based systems, including observation that RFClock performs as well as the Octoclock, with less than 5 nano-second level time deviation and operates in the 95 percentile for 0.21 Hz and 0.93 Hz frequency offset at 915 MHz and 2.4 GHz, respectively.

Demonstration of how RFClock can operate flexibly in GPS-enabled and GPS-denied environments using a selection of GPS and UWB, and in presence of rich multipath indoor/outdoor settings.

Integration of RFClock with Ettus B210 SDRs for a 5-node DCB setup, wherein four transmitting SDRs act as a virtual antenna phased array with coherent signal combination at the receiver.

Verification of the expected increase in channel gain. Moreover, the resulting beamforming shows Bit Error Rate (BER) probability close to $10^{-6}$ for BPSK and QPSK modulation schemes in moderate SNR regime.

As used herein, "consisting essentially of" allows the inclusion of materials or steps that do not materially affect the basic and novel characteristics of the claim. Any recitation herein of the term "comprising," particularly in a description of components of a composition or in a description of elements of a device, can be exchanged with "consisting essentially of" or "consisting of."

The present technology has been described in conjunction with certain preferred embodiments and aspects. It is to be understood that the technology is not limited to the exact details of construction, operation, exact materials or embodiments or aspects shown and described, and that various modifications, substitution of equivalents, alterations to the compositions, and other changes to the embodiments and aspects disclosed herein will be apparent to one of skill in the art.

What is claimed is:

1. A method for self-synchronizing a software defined radio apparatus, comprising:
  instructing, by a leader module of an RF clock module of the software defined radio apparatus and via a controller module comprising a central coordinator operative to provide a data bridge, a radio frequency (RF) transceiver to transmit a two-tone frequency signal at $f_1$ and $f_2$ over air, separated by a desired input clock frequency, the RF transceiver operative to receive and transmit RF signals;
  receiving, at a follower module, a transmitted signal;
  extracting, by the follower module, an envelope of the received transmitted signal; and
  passing the received transmitted signal through a filter to obtain a reference clock without modifying existing physical/link layer protocols.

2. The method of claim 1, further comprising amplifying, via a RF power amplifier, the two-tone frequency signal prior to transmission of the two-tone signal by the transceiver.

3. The method of claim 1, wherein the step of extracting further comprises passing the received transmitted signal through a 4-stage rectifier.

4. The method of claim 1, further comprising generating the two-tone signal by a RF frequency synthesizer locked to a reference signal of a reference oscillator of the software defined radio apparatus.

5. The method of claim 4, further comprising combining the generated two-tone signal via an RF power-combiner.

6. The method of claim 1, wherein the received transmitted signal is received by the RF transceiver.

7. The method of claim 1, wherein the received transmitted signal is received by a second RF transceiver.

8. The method of claim 4, further comprising correcting the reference signal of the reference oscillator according to a pulse per second signal from a pulse per second generator of the software defined radio apparatus.

9. A software defined radio apparatus, comprising:
  a radio frequency (RF) transceiver operative to receive and transmit RF signals;
  a controller module comprising a central coordinator operative to provide a data bridge; and
  an RF clock module comprising:
    a leader module operative to instruct the RF transceiver, via the controller module, to transmit a two-tone frequency signal at $f_1$ and $f_2$ over air, separated by a desired input clock frequency, and
    a follower module operative to extract an envelope of a signal received by the transceiver and pass the signal through a filter to obtain a reference clock without modifying existing physical/link layer protocols.

10. The software defined radio apparatus of claim 9, wherein the leader module further comprises a reference oscillator for generating a reference signal.

11. The software defined radio apparatus of claim 10, wherein the leader module further comprises a RF frequency synthesizer locked to the reference signal of the reference oscillator for generating the two-tone signal.

12. The software defined radio apparatus of claim 11, wherein the leader module further comprises a RF power-combiner configured for combining the generated two-tone signal.

13. The software defined radio apparatus of claim 12, wherein the leader module further comprises a RF power amplifier configured for amplifying the combined two-tone signal.

14. The software defined radio apparatus of claim 10, further comprising a pulse per second generator configured to produce a pulse per second signal.

15. The software defined radio apparatus of claim 14, wherein the controller module is configured to correct the reference signal of the reference oscillator consistent with the pulse per second signal of the pulse per second generator.

16. The software defined radio apparatus of claim 9, wherein the follower module further comprises a 4-stage rectifier configured to extract the envelope of the received signal.

17. The software defined radio apparatus of claim 9, wherein the filter is a band pass filter.

18. The software defined radio apparatus of claim 9, wherein the filter is an adjustable impedance matching filter.

19. The software defined radio apparatus of claim 9, further comprising a second RF transceiver configured to receive the received signal.

* * * * *